US011875752B2

United States Patent
Yang et al.

(10) Patent No.: US 11,875,752 B2
(45) Date of Patent: Jan. 16, 2024

(54) DISPLAY PANEL COMPRISING INITIALIZATION SIGNAL LINE WITH PROTRUDING PORTION, DISPLAY DEVICE AND MANUFACTURE METHOD FOR THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huijuan Yang, Beijing (CN); Tingliang Liu, Beijing (CN); Xiaofeng Jiang, Beijing (CN); Huijun Li, Beijing (CN); Shun Zhang, Beijing (CN); Yu Wang, Beijing (CN); Jie Dai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 477 days.

(21) Appl. No.: 17/258,851

(22) PCT Filed: Mar. 25, 2020

(86) PCT No.: PCT/CN2020/081195
§ 371 (c)(1),
(2) Date: Jan. 8, 2021

(87) PCT Pub. No.: WO2021/189323
PCT Pub. Date: Sep. 30, 2021

(65) Prior Publication Data
US 2021/0358420 A1 Nov. 18, 2021

(51) Int. Cl.
*G09G 3/3275* (2016.01)
*G09G 3/3233* (2016.01)
(Continued)

(52) U.S. Cl.
CPC ......... *G09G 3/3275* (2013.01); *G09G 3/3233* (2013.01); *H10K 59/121* (2023.02);
(Continued)

(58) Field of Classification Search
CPC .. H10K 59/121; H10K 59/123; H10K 59/131; G09G 2300/0426
See application file for complete search history.

(56) References Cited

U.S. PATENT DOCUMENTS

2007/0040770 A1 2/2007 Kim
2016/0043159 A1* 2/2016 Kim ................ H10K 59/131
257/71
(Continued)

OTHER PUBLICATIONS

Extended (Supplementary) European Search Report dated Sep. 25, 2023 in EP-20897672, 12 pages.

*Primary Examiner* — Nduka E Ojeh
(74) *Attorney, Agent, or Firm* — Muncy, Geissler, Olds & Lowe, P.C.

(57) ABSTRACT

A display panel, a manufacture method thereof and a display device are provided. The display panel includes multiple subpixel zones and a reset signal line pattern, an initialization signal line pattern and a conductive connecting part pattern in each of the subpixel zones. The initialization signal line pattern includes a first body portion and a first protruding portion coupled to each other. The orthographic projection of the first body portion onto the base is between the orthographic projection of the first protruding portion onto the base and the orthographic projection of the reset signal line pattern onto the base. The orthographic projection of a first end portion of the conductive connecting part (Continued)

pattern onto the base and the orthographic projection of the first protruding portion onto the base have a first overlapped region.

20 Claims, 31 Drawing Sheets

(51) Int. Cl.
*H10K 59/121* (2023.01)
*H10K 59/123* (2023.01)
*H10K 59/131* (2023.01)

(52) U.S. Cl.
CPC ......... *H10K 59/123* (2023.02); *H10K 59/131* (2023.02); *G09G 2300/0426* (2013.01); *G09G 2300/0842* (2013.01); *G09G 2310/061* (2013.01)

(56) References Cited

U.S. PATENT DOCUMENTS

| | | | |
|---|---|---|---|
| 2016/0240601 A1 | 8/2016 | Kwon et al. | |
| 2017/0358262 A1 | 12/2017 | Moon | |
| 2021/0193780 A1* | 6/2021 | Diao | H01L 29/78633 |
| 2021/0335989 A1* | 10/2021 | Diao | H10K 71/00 |

* cited by examiner

DISPLAY PANEL COMPRISING INITIALIZATION SIGNAL LINE WITH PROTRUDING PORTION, DISPLAY DEVICE AND MANUFACTURE METHOD FOR THE SAME

CROSS-REFERENCE TO RELATED APPLICATION

The present application is a U.S. national phase application of a PCT Application No. PCT/CN2020/081195 filed on Mar. 25, 2020, the disclosure of which is incorporated herein by reference in its entirety.

TECHNICAL FIELD

The present disclosure relates to the field of display technology, in particular to a display panel and manufacture method thereof and a display device.

BACKGROUND

With rapid development of organic light-emitting diode (OLED) display technology, consumers have increasingly higher requirements on screen-to-body ratio and resolution of OLED display devices. The screen-to-body ratio of an OLED display device refers to the ratio of an active area (AA area) to the front panel of the display device, and the resolution of an OLED display device refers to the quantity of pixel structures included in the AA area. The greater the screen-to-body ratio of the OLED display device, the better the consumer experience. The higher the resolution of the OLED display device, the clearer the images it displays is.

SUMMARY

An object of the present disclosure is to provide a display panel and manufacture method thereof and a display device.

In a first aspect, the present disclosure provides a display panel including a base, and functional film layers disposed on the base. The display panel further includes a plurality of subpixel zones arranged in an array.

The functional film layers include a reset signal line layer, an initialization signal line layer, and a conductive connecting part layer.

The reset signal line layer includes a reset signal line pattern disposed in each of the plurality of subpixel zones, the reset signal line pattern extending along a first direction.

The initialization signal line layer includes an initialization signal line pattern disposed in each of the plurality of subpixel zones. The initialization signal line pattern includes a first body portion and a first protruding portion coupled to each other. The first body portion extends along the first direction. In the same subpixel zone, an orthographic projection of the first body portion onto the base is between an orthographic projection of the first protruding portion onto the base and an orthographic projection of the reset signal line pattern onto the base.

The conductive connecting part layer includes a conductive connecting part pattern disposed in each of the plurality of subpixel zones. In the same subpixel zone, an orthographic projection of a first end portion of the conductive connecting part pattern onto the base and the orthographic projection of the first protruding portion onto the base have a first overlapped region. In the first overlapped region, the first end portion is coupled to the first protruding portion and a second end portion of the conductive connecting part pattern is coupled to the target coupling part in the subpixel zone where the conductive connecting part pattern is located. The orthographic projection of the reset signal line pattern onto the base is between an orthographic projection of the target coupling part onto the base and an orthographic projection of the initialization signal line pattern onto the base.

Optionally, the display panel further includes a plurality of light-emitting elements in a one-to-one correspondence with the plurality of subpixel zones, wherein the plurality of light-emitting elements is on a side of the functional film layer facing away from the base; and a plurality of subpixel driving circuits in a one-to-one correspondence with the plurality of subpixel zones, wherein each of the plurality of subpixel driving circuits includes a seventh transistor, a gate electrode of the seventh transistor is coupled to a corresponding reset signal line pattern, a first electrode of the seventh transistor acts as the target coupling part, a second electrode of the seventh transistor extends along a second direction and is coupled to an anode of a corresponding light-emitting element.

The conductive connecting part pattern further includes a second body portion connected between the first end portion and the second end portion, wherein the second body portion extends along a second direction. In the same subpixel zone, along the first direction, the first end portion of the conductive connecting part pattern protrudes from the second body portion in a direction away from the second electrode of the seventh transistor.

Optionally, the functional film layer further includes a data line pattern in each of the plurality of subpixel zones, the data line pattern including a portion that extends along the second direction.

The orthographic projection of the initialization signal line pattern onto the base and an orthographic projection of the conductive connecting part pattern onto the base have a third overlapped region.

The orthographic projection of the initialization signal line pattern onto the base and an orthographic projection of the data line pattern onto the base have a fourth overlapped region.

A width of the initialization signal line pattern along the second direction in the fourth overlapped region is less than a width of the initialization signal line pattern along the second direction in the third overlapped region.

Optionally, in the same subpixel zone, there is a first gap between an orthographic projection of the second body portion onto the base and an orthographic projection of the second electrode of the seventh transistor onto the base, the first gap being greater than a threshold value.

Optionally, the display panel further includes a plurality of subpixel driving circuits in a one-to-one correspondence with the plurality of subpixel zones, wherein each of the plurality of subpixel driving circuits includes a driving transistor and a second transistor.

The gate electrode of the second transistor is coupled to the reset signal line pattern in the previous subpixel zone adjacent along the second direction, a first electrode of the second transistor acts as the target coupling part in the previous subpixel zone, and a second electrode of the second transistor is coupled to a gate electrode of the driving transistor.

The second transistor includes two semiconductor portions disposed in a spaced manner along the first direction and a first conductor portion connected to the two semiconductor portions, an orthographic projection of the first conductor portion onto the base does not overlap with an orthographic projection of the first protruding portion in the previous subpixel zone onto the base.

Optionally, the orthographic projection of the first conductor portion onto the base overlaps with an orthographic projection of the first end portion of the conductive connecting part pattern in the previous subpixel zone onto the base.

Optionally, each of the initialization signal line patterns further includes a second protruding portion coupled to the first body portion. In the same subpixel zone, an orthographic projection of the second protruding portion onto the base is between an orthographic projection of the first body portion onto the base and the orthographic projection of the reset signal line pattern onto the base, and the orthographic projection of the first conductor portion onto the base overlaps with the orthographic projection of the second protruding portion onto the base.

Optionally, the conductive connecting part pattern further includes a second body portion connected between the first end portion and the second end portion, the second body portion extending along a second direction.

An end of the first conductor portion that is close to the conductive connecting part pattern in the previous subpixel zone extends along the second direction. There is a second gap between an orthographic projection of the end onto the base and the orthographic projection of the second body portion of the conductive connecting part pattern onto the base, the second gap being greater than a threshold value.

Optionally, in the same subpixel zone, the orthographic projection of the first end portion of the conductive connecting part pattern onto the base and the orthographic projection of the first body portion of the initialization signal line pattern onto the base further have a second overlapped region.

The functional film layer further includes a first connecting hole in each of the plurality of subpixel zones. In the same subpixel zone, the orthographic projection of the first connecting hole onto the base overlaps with the first overlapped region and the second overlapped region. The first end portion of the conductive connecting part pattern is coupled to the initialization signal line pattern through the first connecting hole.

Optionally, the orthographic projection of the first conductor portion of the second transistor onto the base does not overlap with an orthographic projection of the first connecting hole in the previous subpixel zone onto the base.

Optionally, the functional film layer further includes a power signal line layer. The power signal line layer includes a power signal line pattern disposed in each of the plurality of subpixel zones. At least part of the power signal line pattern extends along the second direction.

An end of the first conductor portion that is far away from the conductive connecting part pattern in the previous subpixel zone extends along the second direction. An orthographic projection of the end onto the base is entirely covered by an orthographic projection of the power signal line pattern in the same subpixel zone onto the base.

Optionally, the display panel further includes a plurality of subpixel driving circuits in a one-to-one correspondence with the plurality of subpixel zones. Each of the plurality of subpixel driving circuits includes a driving transistor and a storage capacitor. The storage capacitor includes a first electrode plate and a second electrode plate that are disposed opposite to each other. The first electrode plate also acts as the gate electrode of the driving transistor. The second electrode plate is on the side of the first electrode plate facing away from the base.

The functional film layers further include a power signal line layer. The power signal line layer includes a power signal line pattern disposed in each of the plurality of subpixel zones. At least part of the power signal line pattern extends along a second direction. The power signal line pattern includes a first power portion and a second power portion.

An orthographic projection of the first power portion onto the base overlaps with an orthographic projection of the reset signal line pattern in the same subpixel zone onto the base and overlaps with an orthographic projection of a gate line pattern in the same subpixel zone onto the base. An orthographic projection of the second power portion onto the base overlaps with an orthographic projection of a second electrode plate of the corresponding storage capacitor onto the base. A width of the first power portion is less than a width of the second power portion along the first direction.

Optionally, the functional film layers further include a power signal line layer. The power signal line layer includes a power signal line pattern disposed in each of the plurality of subpixel zones. At least part of the power signal line pattern extends along a second direction.

The functional film layer further includes an auxiliary power layer. The auxiliary power layer includes an auxiliary power pattern disposed in each of the plurality of subpixel zones. An orthographic projection of the auxiliary power pattern onto the base and the orthographic projection of the power signal line pattern in the same subpixel zone onto the base have an overlapped region. The auxiliary power pattern is coupled to the power signal line pattern in this overlapped region.

Optionally, the display panel further includes a plurality of subpixel driving circuits in a one-to-one correspondence with the plurality of subpixel zones. Each of the plurality of subpixel driving circuits includes a driving transistor and a second transistor.

The gate electrode of the second transistor is coupled to the reset signal line pattern in the previous subpixel zone adjacent along the second direction. A first electrode of the second transistor acts as the target coupling part in the previous subpixel zone. A second electrode of the second transistor includes a first electrode portion and a second electrode portion coupled to each other. The first electrode portion extends along the second direction and the second electrode portion extends along the third direction, the third direction intersecting with both the first direction and the second direction. The first electrode portion is between the semiconductor portion of the second transistor and the second electrode portion, and the second electrode portion is coupled to the gate electrode of the driving transistor.

An orthographic projection of the first electrode portion onto the base and an orthographic projection of the second electrode portion onto the base are both covered by the orthographic projection of the auxiliary power pattern onto the base.

Optionally, the auxiliary power pattern includes a first auxiliary sub-pattern and a second auxiliary sub-pattern coupled to each other. The first auxiliary sub-pattern extends along the second direction and at least part of the second auxiliary sub-pattern extends along the first direction.

An orthographic projection of the first auxiliary sub-pattern onto the base covers the orthographic projection of the first electrode portion onto the base and the orthographic projection of the second electrode portion onto the base.

Optionally, a width of the first auxiliary sub-pattern is greater than a width of the corresponding power signal line pattern along the first direction.

Optionally, the orthographic projection of the first electrode portion onto the base and the orthographic projection of the second electrode portion onto the base are both covered by the orthographic projection of the corresponding power signal line pattern onto the base.

Optionally, the functional film layers include a gate line pattern and a light-emission control signal line pattern in each of the plurality of subpixel zones. In the same subpixel zone, the gate line pattern, the light-emission control signal line pattern, the reset signal line pattern and the initialization signal line pattern are sequentially arranged along the second direction.

The functional film layers further include a power signal line pattern and a data line pattern in each of the plurality of subpixel zones. The power signal line pattern and the data line pattern both include a portion extending along the second direction.

The display panel further includes: light-emitting elements in a one-to-one correspondence with the plurality of subpixel zones; and subpixel driving circuits in a one-to-one correspondence with the plurality of subpixel zones, wherein each subpixel driving circuit includes a driving transistor, a first transistor, a second transistor, a fourth transistor, a fifth transistor, a sixth transistor and a seventh transistor.

In the same subpixel zone, a gate electrode of the driving transistor is coupled to a second electrode of the first transistor, a first electrode of the driving transistor is coupled to a second electrode of the fifth transistor, and a second electrode of the driving transistor is coupled to a first electrode of the first transistor.

A gate electrode of the first transistor is coupled to the gate line pattern.

A gate electrode of the second transistor is coupled to the reset signal line pattern in the previous subpixel zone adjacent along the second direction, a first electrode of the second transistor acts as the target coupling part in the previous subpixel zone and a second electrode of the second transistor is coupled to the gate electrode of the driving transistor.

A gate electrode of the fourth transistor is coupled to the gate line pattern, a first electrode of the fourth transistor is coupled to the data line pattern, and a second electrode of the fourth transistor is coupled to a first electrode of the driving transistor.

A gate electrode of the fifth transistor is coupled to the light-emission control signal line pattern, and a first electrode of the fifth transistor is coupled to the power signal line pattern.

A gate electrode of the sixth transistor is coupled to the light-emission control signal line pattern, a first electrode of the sixth transistor is coupled to a second electrode of the driving transistor, and a second electrode of the sixth transistor is coupled to the corresponding light-emitting element.

A second electrode of the seventh transistor is coupled to the light-emitting element, a gate electrode of the seventh transistor is coupled to the reset signal line pattern, and a first electrode of the seventh transistor is coupled to the second initialization signal line pattern.

Based on the technical solution of the display panel described above, in a second aspect, the present disclosure provides a display device including the display panel described above.

Based on the technical solution of the display panel described above, in a third aspect, the present disclosure provides a manufacture method of a display panel. The method includes manufacturing functional film layers on a base and forming a plurality of subpixel zones arranged in an array.

The functional film layers include a reset signal line layer, an initialization signal line layer and a conductive connecting part layer.

The reset signal line layer includes a reset signal line pattern disposed in each of the plurality of subpixel zones, the reset signal line pattern extending along the first direction.

The initialization signal line layers include an initialization signal line pattern disposed in each of the plurality of subpixel zones. The initialization signal line pattern includes a first body portion and a first protruding portion coupled to each other. The first body portion extends along the first direction. In the same subpixel zone, an orthographic projection of the first body portion onto the base is between an orthographic projection of the first protruding portion onto the base and an orthographic projection of the reset signal line pattern onto the base.

The conductive connecting part layer includes a conductive connecting part pattern disposed in each of the plurality of subpixel zones. In the same subpixel zone, an orthographic projection of a first end portion of the conductive connecting part pattern onto the base and the orthographic projection of the first protruding portion onto the base have a first overlapped region. In the first overlapped region, the first end portion is coupled to the first protruding portion, a second end portion of the conductive connecting part pattern is coupled to a target coupling part in the subpixel zone where the conductive connecting part pattern is located, and an orthographic projection of the reset signal line pattern onto the base is between an orthographic projection of the target coupling part onto the base and an orthographic projection of the initialization signal line pattern onto the base.

BRIEF DESCRIPTION OF THE DRAWINGS

The drawings described here are intended to provide further understanding of the present disclosure and constitute a part of the present disclosure. The illustrative embodiments of the present disclosure and description thereof are intended to explain the present disclosure, and do not constitute improper limitation on the present disclosure. In the drawings.

DETAILED DESCRIPTION

For further explanation of a display panel and manufacture method thereof and a display device according to embodiments of the present disclosure, detailed description will be made below with reference to drawings of the specification.

The structure of an active matrix organic light emitting diode (AMOLED) display panel includes a base; a plurality of subpixel driving circuits disposed on the base and a plurality of light-emitting elements disposed on a side of the subpixel driving circuit facing away from the base. The light-emitting elements are in a one-to-one correspondence with the subpixel driving circuits. The subpixel driving circuit is configured to drive a corresponding light-emitting element to emit light and thus provide the display function of the display panel.

Figure 1:
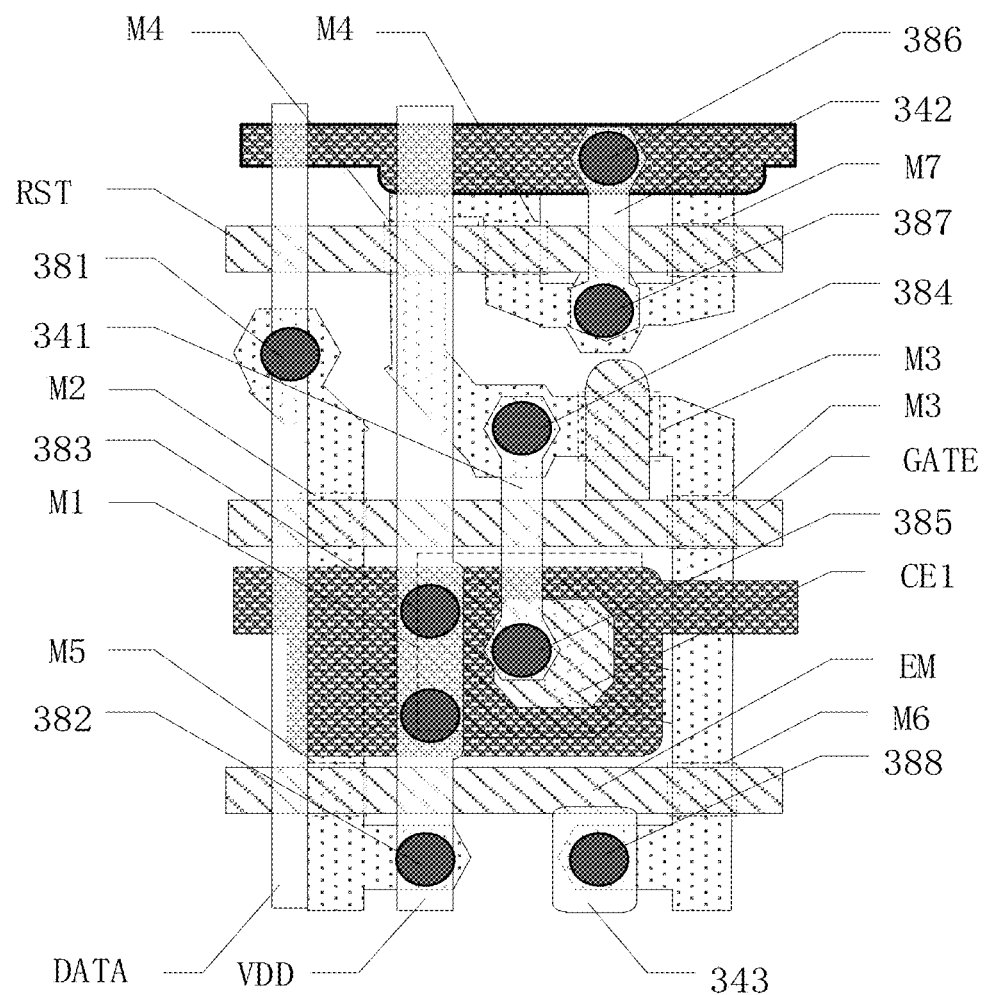
FIG. 1 is a schematic layout view of a subpixel in the related art.
Figure 2:
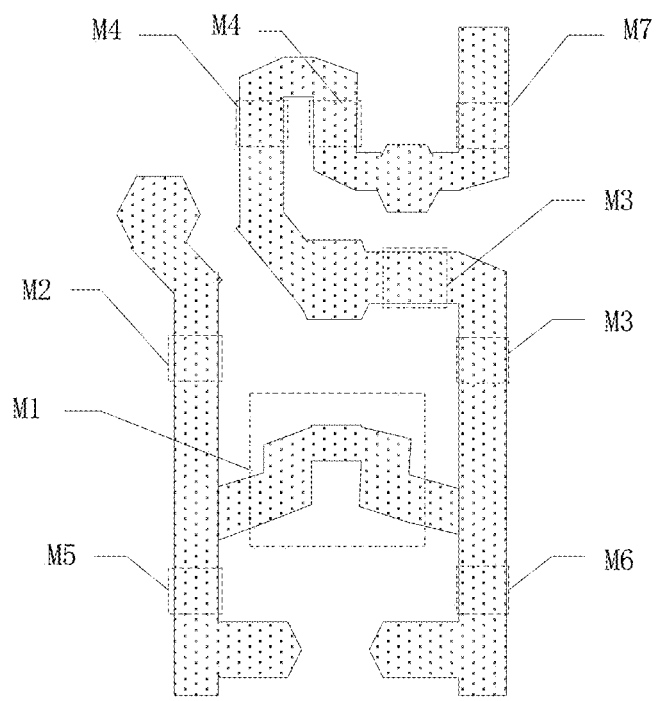
FIG. 2 is a schematic layout view of an active layer in FIG. 1.
Figure 3:
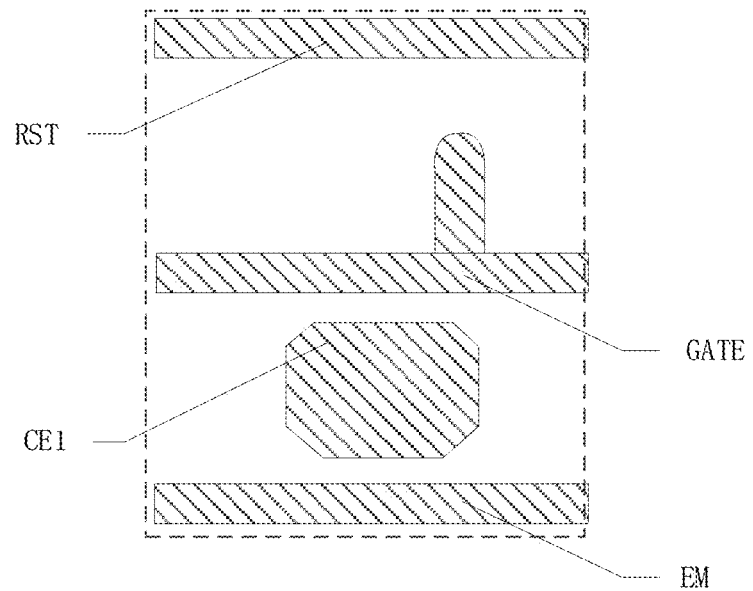
FIG. 3 is a schematic layout view of a first gate metal layer in FIG. 1.
Figure 4:
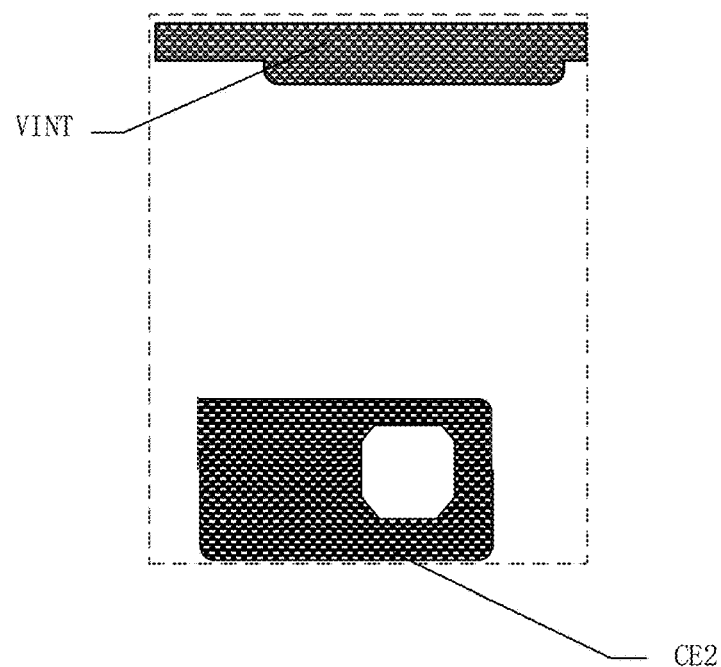
FIG. 4 is a schematic layout view of a second gate metal layer in FIG. 1.
Figure 5:
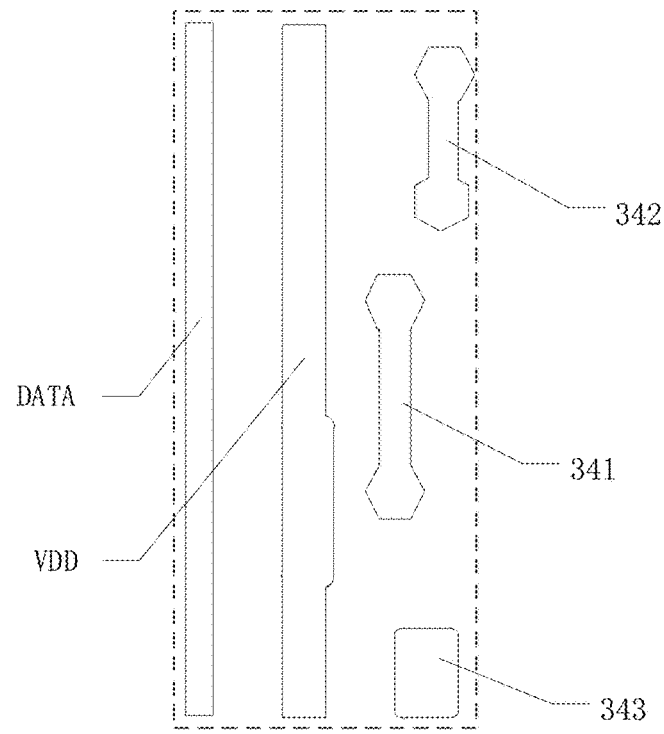
FIG. 5 is a schematic layout view of a source-drain metal layer in FIG. 1.

In the related art, the subpixel driving circuit generally includes a plurality of thin film transistors, as shown in FIG. 1. FIG. 1 shows a specific layout of 7 thin film transistors M1-M7 in the case that the subpixel driving circuit includes the 7 thin film transistors. When laid out in this manner, the subpixel driving circuit includes an active layer shown in FIG. 2, a first metal layer shown in FIG. 3, a second metal layer shown in FIG. 4, and a third metal layer shown in FIG. 5. The active layer includes an active pattern for forming the channel region of each thin film transistor (e.g., the portion inside the dashed line box in FIG. 2) and a doped active pattern with electrical conductivity property coupled to the active pattern (e.g., the portion outside the dashed line box in FIG. 2). The first metal layer includes: the gate electrode of each thin film transistor, a scan signal line GATE to which the gate electrode is coupled, an electrode plate CE1 of the storage capacitor in the subpixel driving circuit, a reset signal line RST and a light-emission control signal line EM. The second metal layer includes: an initialization signal line VINT and another electrode plate CE2 of the storage capacitor in the subpixel driving circuit. The third metal layer includes a data line DATA, a power signal line VDD and some conductive connecting parts (e.g., designated as 341 to 343).

It is noted that, as shown in FIG. 1, in laying out the subpixel driving circuit, some through holes (e.g., designated as 381 to 388) can further be provided in order to provide coupling between functional patterns disposed on different layers.

Figure 6:
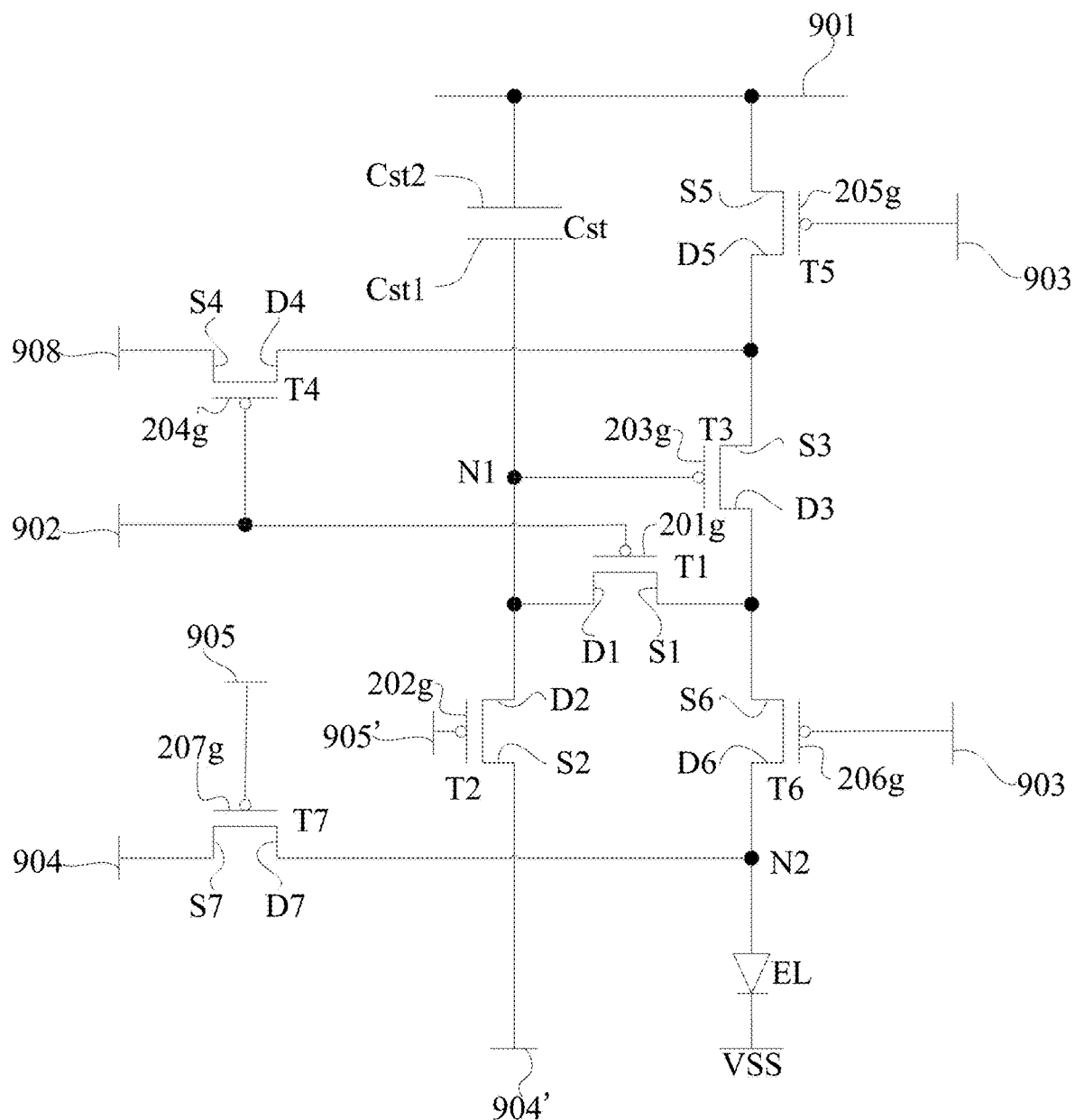
FIG. 6 is a circuit diagram of a subpixel driving circuit according to an embodiment of the present disclosure.
Figure 8:
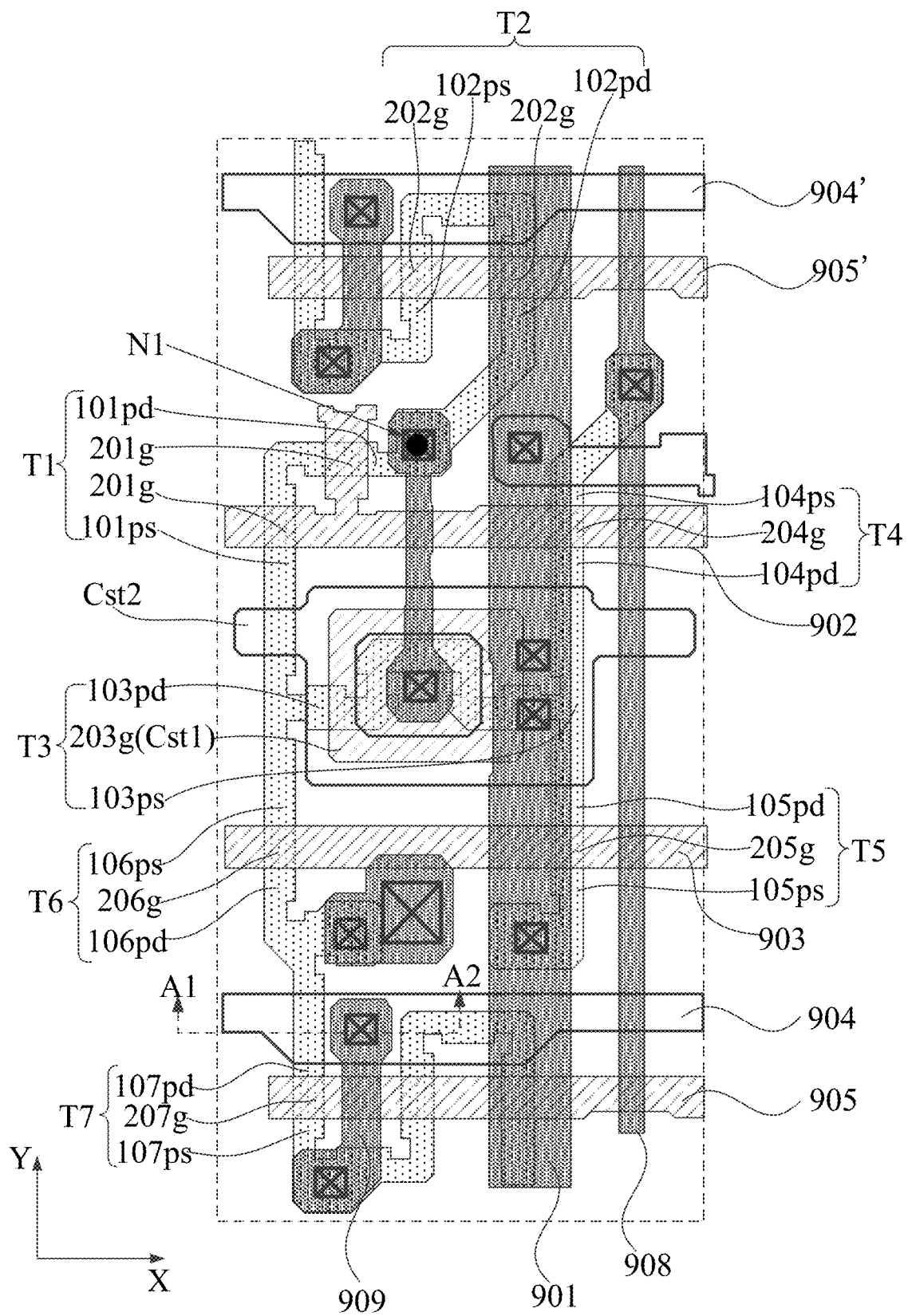
FIG. 8 is a first schematic layout view of a subpixel zone according to an embodiment of the present disclosure.
Figure 14:
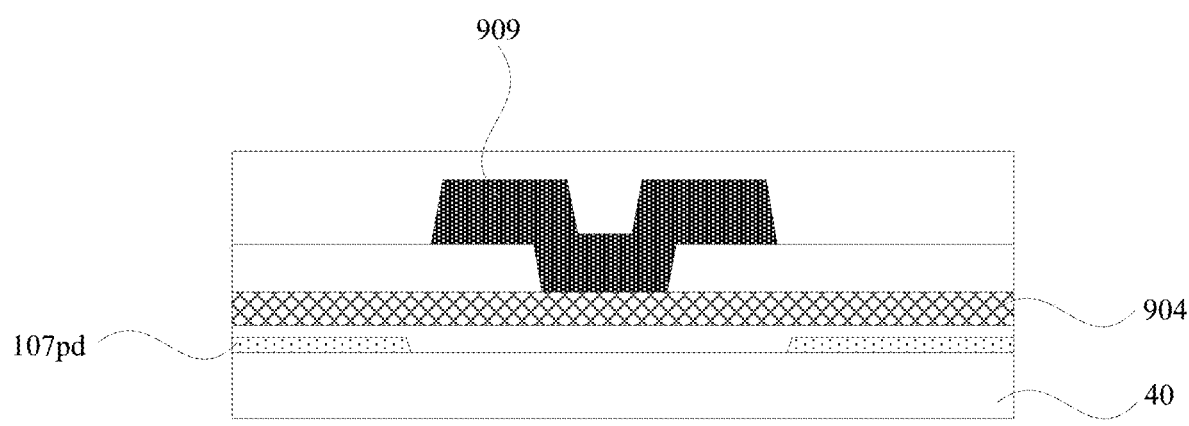
FIG. 14 is a schematic sectional view along the A1-A2 direction in FIG. 8.

As shown in FIG. 6, FIG. 8 and FIG. 14, the present disclosure provides a display panel. The display panel includes a plurality of subpixel driving circuits. The display panel further provides a power signal line pattern 901, a data line pattern 908, a gate line pattern 902, a light-emission control signal line pattern 903, a reset signal line pattern 905 and an initialization signal line pattern 904. At least part of the power signal line pattern 901 and the data line pattern 908 extend along the second direction. The gate line pattern 902, the light-emission control signal line pattern 903, the reset signal line pattern 905 and the initialization signal line pattern 904 all extend along the first direction. The first direction intersects with the second direction. For example, the first direction includes X direction and the second direction includes Y direction.

Figure 9:
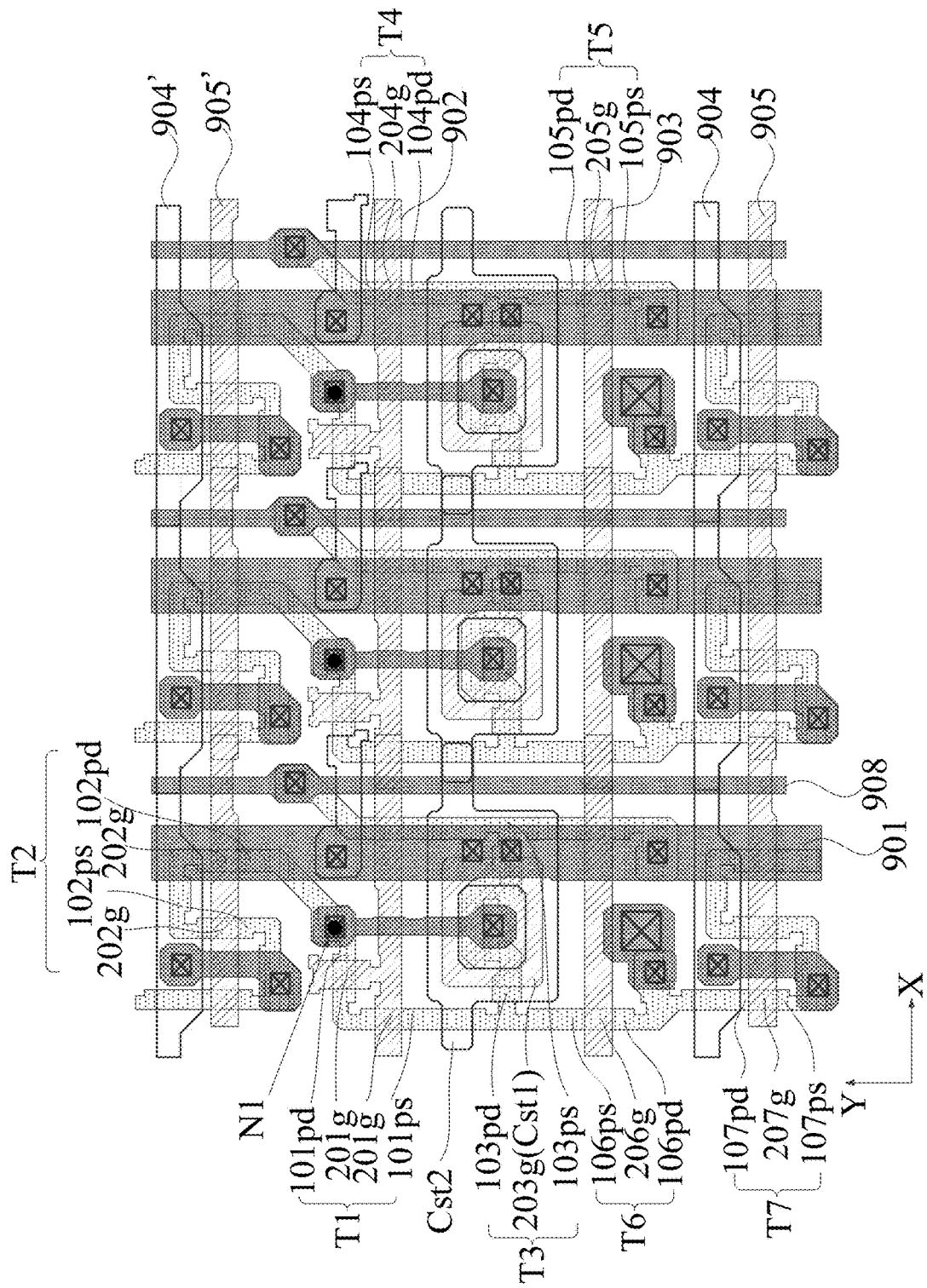
FIG. 9 is a second schematic layout view of a subpixel zone according to an embodiment of the present disclosure.

As shown in FIG. 9, the plurality of subpixel driving circuits can be divided into a plurality of rows of subpixel driving circuits arranged sequentially along the second direction and a plurality of columns of subpixel driving circuits arranged sequentially along the first direction. The initialization signal line patterns 904 corresponding to the subpixel driving circuits in the same row are electrically connected sequentially to form an integral structure. The gate line patterns 902 corresponding to the subpixel driving circuits in the same row are electrically connected sequentially to form an integral structure. The light-emission control signal line patterns 903 corresponding to the subpixel driving circuits in the same row are electrically connected sequentially to form an integral structure. The reset signal line patterns 905 corresponding to the subpixel driving circuits in the same row are electrically connected sequentially to form an integral structure. The data line patterns 908 corresponding to the subpixel driving circuits in the same column are electrically connected sequentially to form an integral structure. The power signal line patterns 901 corresponding to the subpixel driving circuits in the same column are electrically connected sequentially to form an integral structure.

For example, each row of subpixel driving circuits includes a plurality of subpixel driving circuits arranged sequentially along the X direction. The initialization signal line pattern 904, the gate line pattern 902, the light-emission control signal line pattern 903 and the reset signal line pattern 905 all extend along the X direction. The plurality of subpixel driving circuits included in each row of subpixel driving circuits each can be coupled to the corresponding initialization signal line pattern 904, gate line pattern 902, light-emission control signal line pattern 903 and reset signal line pattern 905. Each column of subpixel driving circuits includes a plurality of subpixel driving circuits arranged sequentially along the Y direction. The data line pattern 908 and power signal line pattern 901 both extend along the Y direction. The plurality of subpixel driving circuits included in each column of subpixel driving circuits each can be coupled to the corresponding data line pattern 908 and power signal line pattern 901.

It is noted that there are a variety of manners of physically dividing the subpixel zones in the display panel. Two specific division manners are presented below as examples.

In a first division manner, as shown in FIG. 8, a first transistor T1, a second transistor T2 at the top of FIG. 8, a third transistor T3, a fourth transistor T4, a fifth transistor T5, a sixth transistor T6 and a seventh transistor T7 at the top of FIG. 8 as well as the gate line pattern 902, the light-emission control signal line pattern 903, a reset signal line pattern 905' at the top of FIG. 8 and an initialization signal line pattern 904' at the top of FIG. 8 may be divided into a subpixel zone (i.e. the current subpixel zone). The second transistor T2 at the bottom of FIG. 8, the seventh transistor T7 at the bottom of FIG. 8, the reset signal line pattern 905 at the bottom of FIG. 8 and the initialization signal line pattern 904 at the bottom of FIG. 8 are all divided into the next subpixel zone adjacent to the current subpixel zone along the Y direction.

In a second division manner, as shown in FIG. 8, the first transistor T1, the second transistor T2 at the bottom of FIG. 8, the third transistor T3, the fourth transistor T4, the fifth transistor T5, the sixth transistor T6 and the seventh transistor T7 at the bottom of FIG. 8 as well as the gate line pattern 902, the light-emission control signal line pattern 903, the reset signal line pattern 905 at the bottom of FIG. 8 and the initialization signal line pattern 904 at the bottom of FIG. 8 may be divided into a subpixel zone (i.e. the current subpixel zone). The second transistor T2 at the top of FIG. 8, the seventh transistor T7 at the top of FIG. 8, the reset signal line pattern 905' at the top of FIG. 8 and the initialization signal line pattern 904' at the top of FIG. 8 are all divided into the previous subpixel zone adjacent to the current subpixel zone along the Y direction.

It is noted that the foregoing second division manner is adopted as the manner of subpixel zone division as described in the present disclosure. With the second division manner, the subpixel driving circuit corresponding to the current subpixel zone (i.e., the subpixel driving circuit corresponding to the structure in FIG. 6) includes: the first transistor T1, the second transistor T2 at the top of FIG. 8, the third transistor T3, the fourth transistor T4, the fifth transistor T5, the sixth transistor T6 and the seventh transistor T7 at the bottom of FIG. 8. The gate electrode 202g of the second transistor T2 at the top of FIG. 8 is coupled to the reset signal line pattern 905' in the previous subpixel zone adjacent along the second direction, the source electrode S2 of the second transistor T2 is coupled to the initialization signal line pattern 904' in the previous subpixel zone, and the drain electrode D2 of the second transistor T2 is coupled to the gate electrode 203g of the third transistor T3.

As shown in FIG. 6 and FIG. 8, taking a subpixel driving circuit as an example, this subpixel driving circuit includes 7 thin film transistors and 1 capacitor. The transistors included in the subpixel driving circuit are all P-type transistors. The first transistor T1 has a dual-gate structure, wherein the gate electrode 201g of the first transistor T1 is coupled to the gate line pattern 902, the source electrode S1 of the first transistor T1 is coupled to the drain electrode D3 of the third transistor T3 (i.e., the driving transistor), and the drain electrode D1 of the first transistor T1 is coupled to the gate electrode 203g of the third transistor T3.

The second transistor T2 has a dual-gate structure, wherein the gate electrode 202g of the transistor T2 is coupled to the reset signal line pattern 905' in the previous subpixel zone adjacent along the second direction, the source electrode S2 of the second transistor T2 is coupled to the initialization signal line pattern 904' in the previous subpixel zone, and the drain electrode D2 of the second transistor T2 is coupled to the gate electrode 203g of the third transistor T3.

The gate electrode 204g of the fourth transistor T4 is coupled to the gate line pattern 902, the source electrode S4 of the fourth transistor T4 is coupled to the data line pattern 908, the drain electrode D4 of the fourth transistor T4 is coupled to the source electrode S3 of the third transistor T3.

The gate electrode 205g of the fifth transistor T5 is coupled to the light-emission control signal line pattern 903, the source electrode S5 of the fifth transistor T5 is coupled to the power signal line pattern 901, and the drain electrode D5 of the fifth transistor T5 is coupled to the source electrode S3 of the third transistor T3.

The gate electrode 206g of the sixth transistor T6 is coupled to the light-emission control signal line pattern 903, the source electrode S6 of the sixth transistor T6 is coupled to the drain electrode D3 of the third transistor T3, and the drain electrode D6 of the sixth transistor T6 is coupled to the anode of the light-emitting element EL.

The gate electrode 207g of the seventh transistor T7 is coupled to the reset signal line pattern 905, the drain electrode D7 of the seventh transistor T7 is coupled to the anode of the corresponding light-emitting element EL, and the source electrode S7 of the seventh transistor T7 is coupled to the initialization signal line pattern 904.

The first electrode plate Cst1 of the storage capacitor Cst also acts as the gate electrode 203g of the third transistor T3, and the second electrode plate Cst2 of the storage capacitor Cst is coupled to the power signal line pattern 901.

Figure 7:
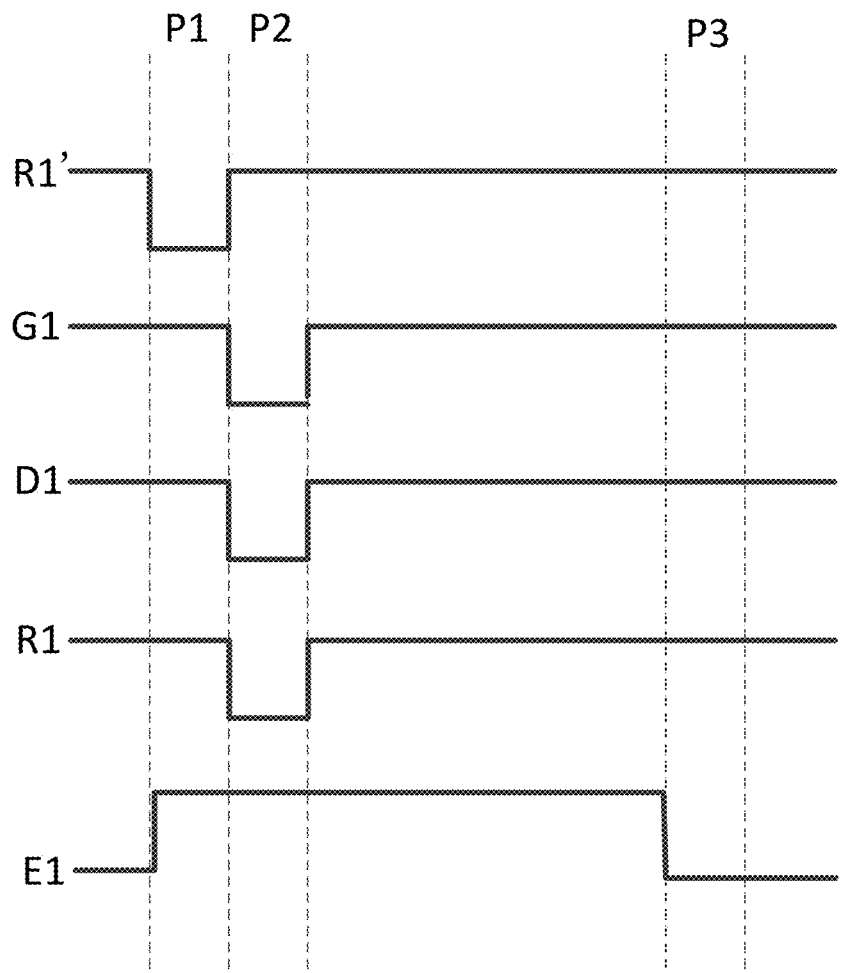
FIG. 7 is a driving timing diagram of a subpixel driving circuit according to an embodiment of the present disclosure.

As shown in FIG. 7, during operation of the display subpixel driving circuit of the structure described above, each operation cycle includes a reset period P1, a write compensation period P2 and a light-emission period P3. In FIG. 7, E1 represents a light-emission control signal transmitted over the light-emission control signal line pattern 903 in the current subpixel zone, R1 represents a reset signal transmitted over the reset signal line pattern 905 in the current subpixel zone, D1 represents a data signal transmitted over the data line pattern 908 in the current subpixel zone, G1 represents a gate scan signal transmitted over the gate line pattern 902 in the current subpixel zone, and R1' represents a reset signal transmitted over the reset signal line pattern 905' in the previous subpixel adjacent to the current subpixel zone along the second direction.

In the first reset period P1, the reset signal input by the reset signal line pattern 905' is at an active electrical level, and the second transistor T2 is turned on to input the initialization signal transmitted by the initialization signal line pattern 904' to the gate electrode 203g of the third transistor T3, so that the gate-source voltage Vgs maintained on the third transistor T3 during the previous frame is cleared, thereby resetting the gate electrode 203g of the third transistor T3.

In the write compensation period P2, the reset signal input by the reset signal line pattern 905' is at an inactive electrical level, and the second transistor T2 is turned off. The gate scan signal input by the gate line pattern 902 is at an active electrical level to control the first transistor T1 and fourth transistor T4 to be turned on. A data signal is written through the data line pattern 908 and is transmitted to the source electrode S3 of the third transistor T3 via the fourth transistor T4. Meanwhile, the first transistor T1 and fourth transistor T4 are turned on, so that the third transistor T3 forms a diode structure. Thus, the first transistor T1, third transistor T3 and fourth transistor T4 cooperate to achieve threshold voltage compensation for the third transistor T3. When the compensation time is sufficiently long, the electrical potential at the gate electrode 203g of the third transistor T3 can be controlled to finally reach Vdata+Vth, wherein Vdata represents the voltage value of the data signal and Vth represents the threshold voltage of the third transistor T3.

In the write compensation period P2, the reset signal input by the reset signal line pattern 905 is at an active electrical level to control the seventh transistor T7 to be turned on. The initialization signal transmitted by the initialization signal line pattern 904 is input to the anode of the light-emitting element EL, and the light-emitting element EL is controlled not to emit light.

In the light emitting period P3, the light-emission control signal written through the light-emission control signal line pattern 903 is at an active electrical level to control the fifth transistor T5 and sixth transistor T6 to be turned on, so that the power signal transmitted by the power signal line pattern 901 is input to the source electrode S3 of the third transistor T3. Meanwhile, since the gate electrode 203g of the third transistor T3 is maintained at Vdata+Vth, the third transistor T3 is turned on. The corresponding gate-source voltage of the third transistor T3 is Vdata+Vth−VDD, wherein VDD is the voltage value corresponding to the power signal. The drain current generated based on the gate-source voltage flows to the anode of the corresponding light-emitting element EL, to drive the corresponding light-emitting element EL to emit light.

As shown in FIG. 10 to FIG. 13, in manufacturing the display subpixel driving circuit described above, the layout of various film layers corresponding to the subpixel driving circuit is as follows: an active film layer, a gate insulation layer, a first gate metal layer, a first interlayer insulation layer, a second gate metal layer, a second interlayer insulation layer, a first source-drain metal layer and a third interlayer insulation layer are disposed in a stacked manner sequentially in a direction away from the base.

Figure 10:
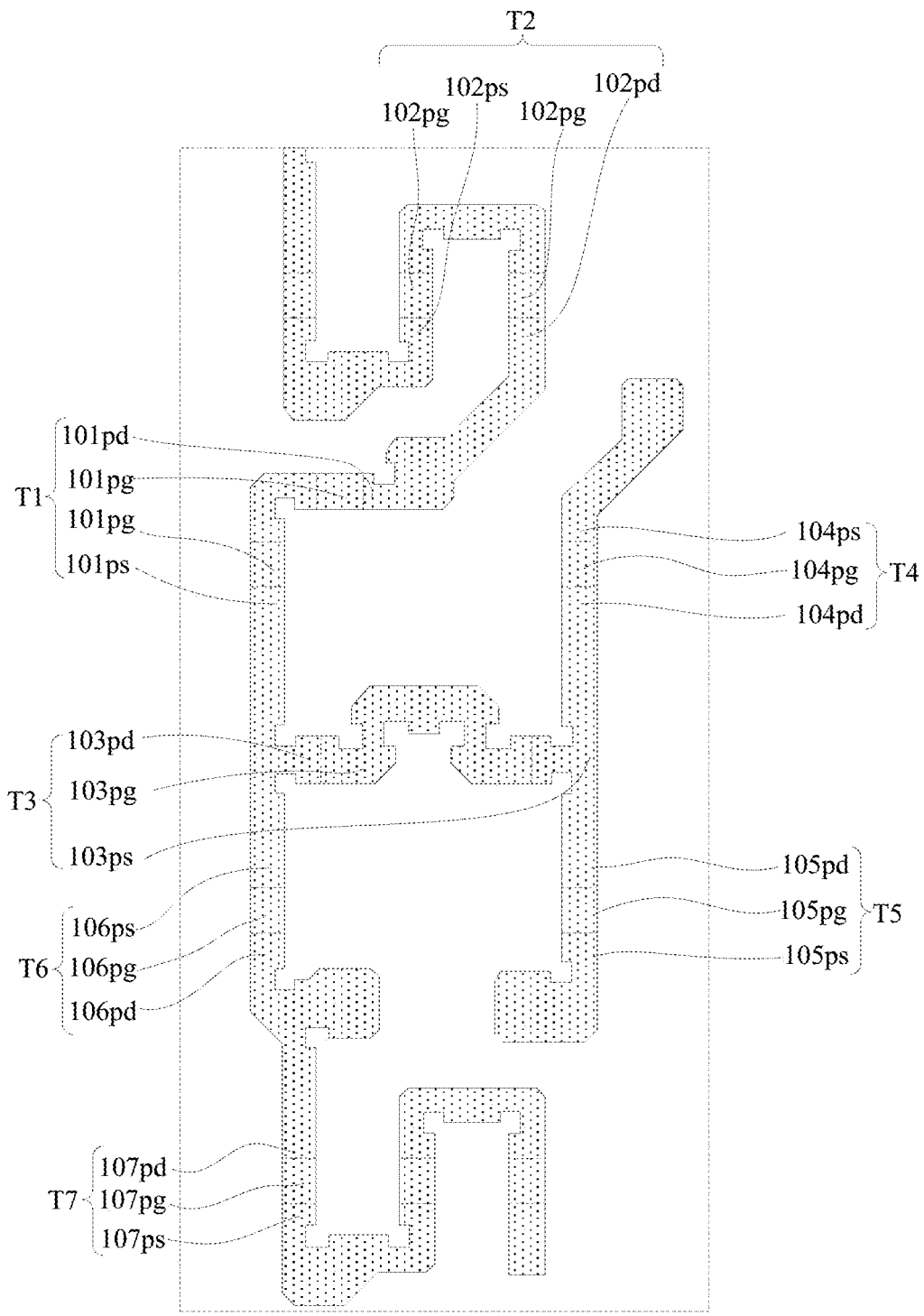
FIG. 10 is a schematic layout view of an active layer in FIG. 8.

As shown in FIG. 10, the active film layer is used to form a channel region (such as 101pg-107pg), a source electrode formation region (such as 101ps-107ps) and a drain electrode formation region (such as 101pd-107pd) of each transistor in the display subpixel driving circuit. The active film layer corresponding to the source electrode formation region and drain electrode formation region, due to the effect of doping, has an electrical conductivity superior than the active film layer corresponding to the channel region. The active film layer may be made of amorphous silicon, polysilicon, an oxide semiconductor material or the like. It is noted that the source electrode region and drain electrode region may be regions doped with n-type or p-type impurity.

In addition, it is noted that the active film layer corresponding to the source electrode formation region or drain electrode formation region may act directly as corresponding source electrode or drain electrode. Optionally, a source electrode in contact with the source electrode formation region may be made of a metal material and a drain electrode in contact with the drain electrode formation region may be made of a metal material.

Figure 11:
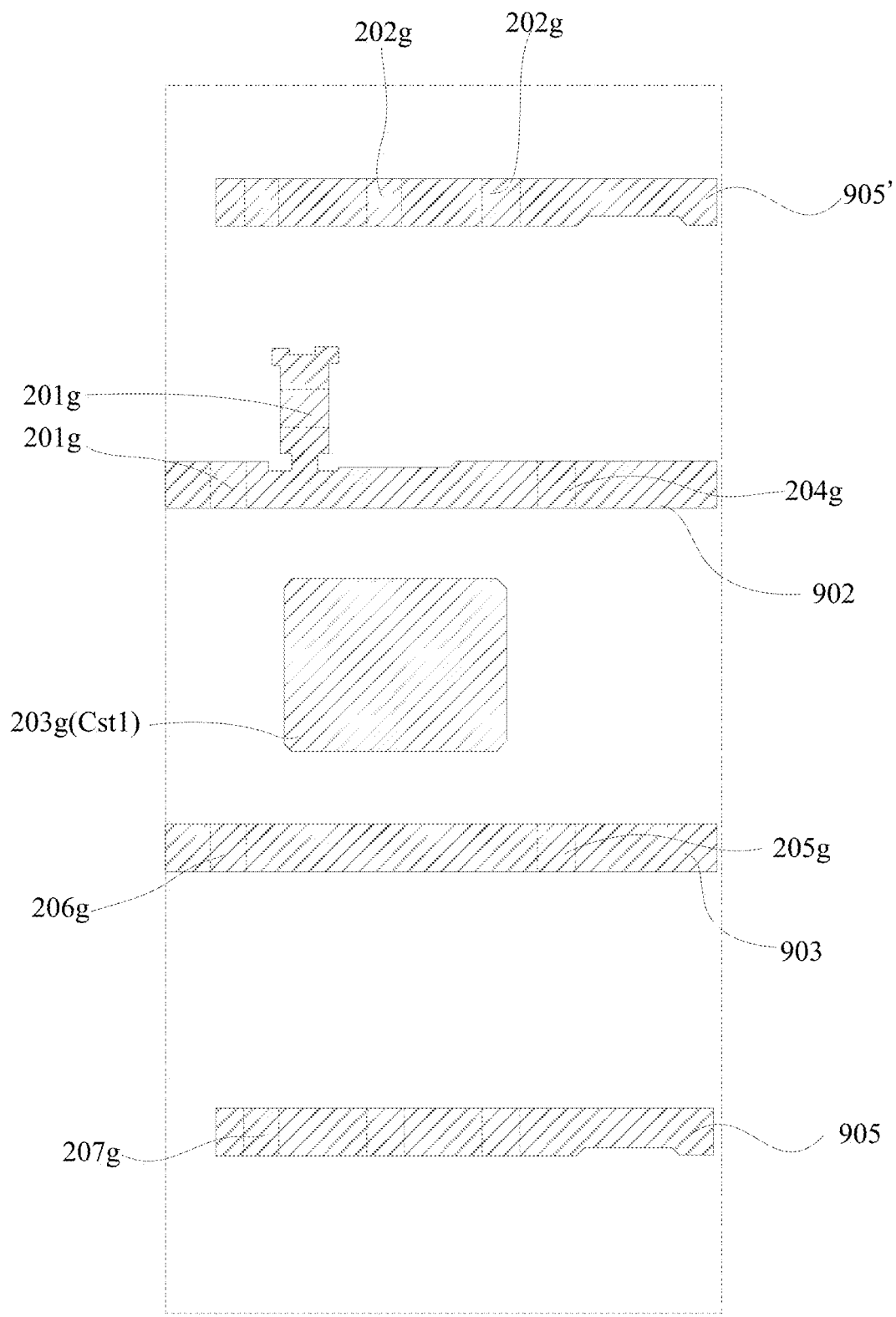
FIG. 11 is a schematic layout view of a first gate metal layer in FIG. 8.

As shown in FIG. 11, the first gate metal layer is used to form the gate electrode (such as 201g-207g) of each transistor in the display subpixel driving circuit and structures, such as the gate line pattern 902, light-emission control signal line pattern 903, reset signal line pattern 905, included in the display substrate. The gate electrode 203g of the third transistor T3 in each display subpixel driving circuit also acts as the first electrode plate Cst1 of the second storage capacitor Cst in the display subpixel driving circuit.

Figure 12:
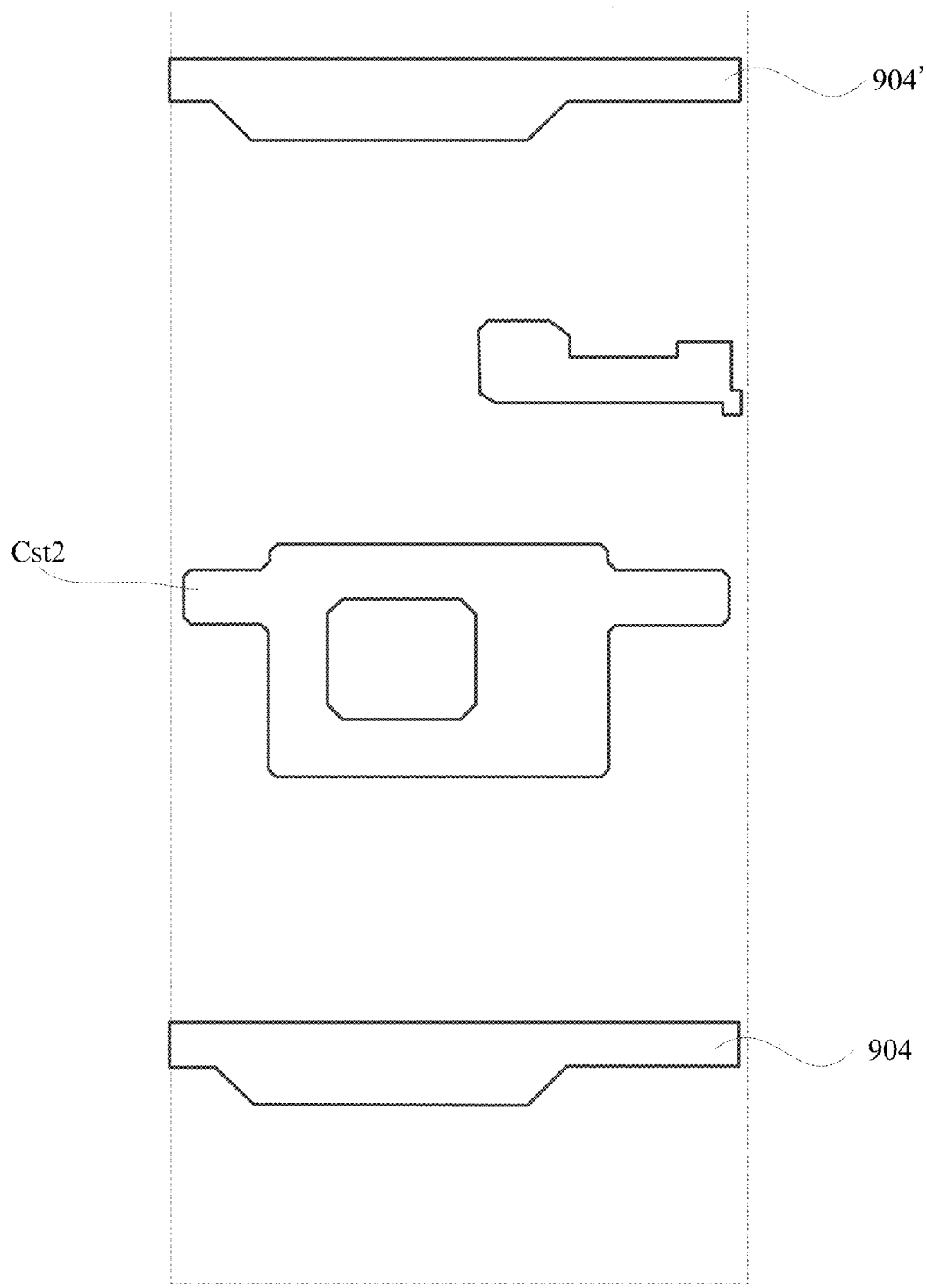
FIG. 12 is a schematic layout view of a second gate metal layer in FIG. 8.

As shown in FIG. 12, the second gate metal layer is used to form the second electrode plate Cst2 of the second storage capacitor Cst and the initialization signal line pattern 904 included in the display substrate.

Figure 13:
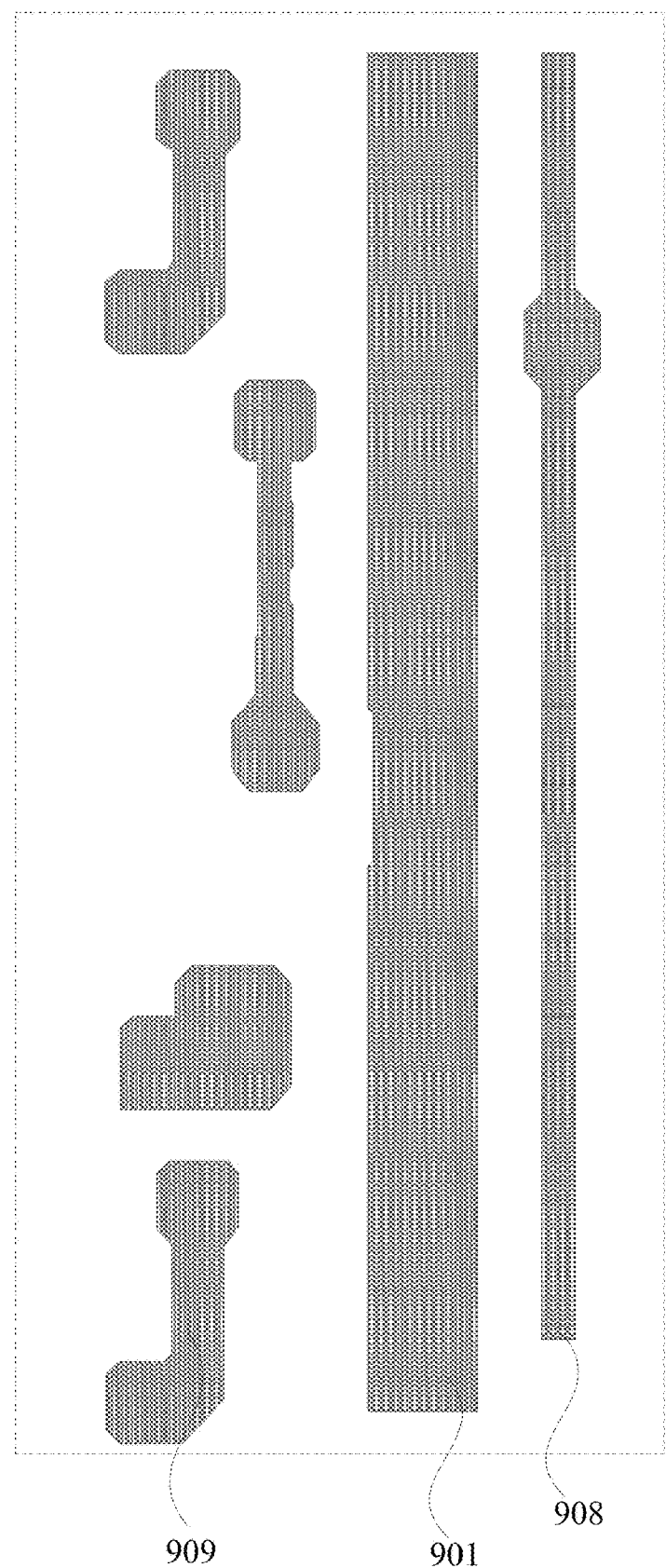
FIG. 13 is a schematic layout view of a source-drain metal layer in FIG. 8.

As shown in FIG. 6, FIG. 8 and FIG. 13, the first source-drain metal layer is used to form the source electrode (such as S1-S7) and drain electrode (such as D1-D7) of each transistor in the display subpixel driving circuit and the data line pattern 908, power signal line pattern 901 and some conductive connecting parts included in the display substrate.

More specifically, with continued reference to FIG. 10 to FIG. 13, the gate electrode 201g of the first transistor T1 covers the first channel region 101pg, the source electrode S1 of the first transistor T1 is in the first source electrode formation region 101ps, and the drain electrode D1 of the first transistor T1 is in the first drain electrode formation region 101pd.

The gate electrode 202g of the second transistor T2 covers the second channel region 102pg, the source electrode S2 of the second transistor T2 is in the second source electrode formation region 102ps, and the drain electrode D2 of the second transistor T2 is in the second drain electrode formation region 102pd.

The gate electrode 203g of the third transistor T3 covers the third channel region 103pg, the source electrode S3 of the third transistor T3 is in the third source electrode formation region 103ps, and the drain electrode D3 of the third transistor T3 is in the third drain electrode formation region 103pd.

The gate electrode 204g of the fourth transistor T4 covers the fourth channel region 104pg, the source electrode S4 of the fourth transistor T4 is in the fourth source electrode formation region 104ps, and the drain electrode D4 of the fourth transistor T4 is in the fourth drain electrode formation region 104pd.

The gate electrode 205g of the fifth transistor T5 covers the fifth channel region 105pg, the source electrode S5 of the fifth transistor T5 is in the fifth source electrode formation region 105ps, and the drain electrode D5 of the fifth transistor T5 is in the fifth drain electrode formation region 105pd.

The gate electrode 206g of the sixth transistor T6 covers the sixth channel region 106pg, the source electrode S6 of the sixth transistor T6 is in the sixth source electrode formation region 106*ps*, and the drain electrode D6 of the sixth transistor T6 is in the sixth drain electrode formation region 106*pd*.

The gate electrode 207*g* of the seventh transistor T7 covers the seventh channel region 107*pg*, the source electrode S7 of the seventh transistor T7 is in the seventh source electrode formation region 107*ps*, and the drain electrode D7 of the seventh transistor T7 is in the seventh drain electrode formation region 107*pd*.

The gate electrode 203*g* of the third transistor T3 also acts as the first electrode plate Cst1 of the storage capacitor Cst, and the second electrode plate Cst2 of the storage capacitor Cst is coupled to the power signal line pattern 901.

In addition, as shown in FIG. 8, in the display panel according to the present disclosure, in the second direction (such as the Y direction), the gate electrode 204*g* of the fourth transistor T4, the gate electrode 201*g* of the first transistor T1 and the gate electrode 202*g* of the second transistor T2 are all on the first side of the gate electrode of the driving transistor (i.e., the gate electrode 203*g* of the third transistor T3) and the gate electrode of the seventh transistor T7, the gate electrode 206*g* of the sixth transistor T6, the gate electrode of the fifth transistor T5 are all on the second side of the gate electrode of the driving transistor. For example, the first and second sides of the gate electrode of the driving transistor are two opposite sides along the second direction. Specifically, the first side of the gate electrode of the driving transistor may be the upper side of the gate electrode of the driving transistor and the second side of the gate electrode of the driving transistor may be the lower side of the gate electrode of the driving transistor. As for the expression lower side, for example, the side of the display substrate that is used for bonding an IC is the lower side of the display substrate, and the lower side of the gate electrode of the driving transistor is the side of the gate electrode of the driving transistor that is closer to the IC. The expression upper side refers to the side opposite to the lower side, for example the side of the gate electrode of the driving transistor that is farther away from the IC.

In the first direction (such as the X direction), the gate electrode 204*g* of the fourth transistor T4 and the gate electrode 205*g* of the fifth transistor T5 are both on the third side of the gate electrode of the driving transistor, and the gate electrode 201*g* of the first transistor T1 and the gate electrode 206*g* of the sixth transistor T6 are both on the fourth side of the gate electrode of the driving transistor. For example, the third and fourth sides of the gate electrode of the driving transistor are two sides opposite to each other along the first direction. Specifically, the third side of the gate electrode of the driving transistor may be the right side of the gate electrode of the driving transistor and the fourth side of the gate electrode of the driving transistor may be the left side of the gate electrode of the driving transistor. As for the expressions left side and right side, for example, in the same subpixel zone, the data line pattern 908 is on the right side of the power signal line pattern 901, and the power signal line pattern 901 is on the right side of the data line pattern 908.

Although the display panel described above can have enhanced resolution, the effect of enhancement is rather limited. Moreover, as can be seen from FIG. 8, in the case that the second transistor T2 and seventh transistor T7 are coupled through a conductive portion 909 to the initialization signal line pattern 904 (904') via a through hole, for a high-resolution display panel, the space for hole drilling is small due to limited layout space. Therefore, in the process of hole drilling, the through hole tends to be mistakenly drilled onto a nearby reset signal line pattern 905 due to process fluctuation, which leads to signal disturbance.

Therefore, for a high-resolution display panel, the foregoing pixel structure in the display panel needs further optimization to solve the problem mentioned above.

Figure 15:
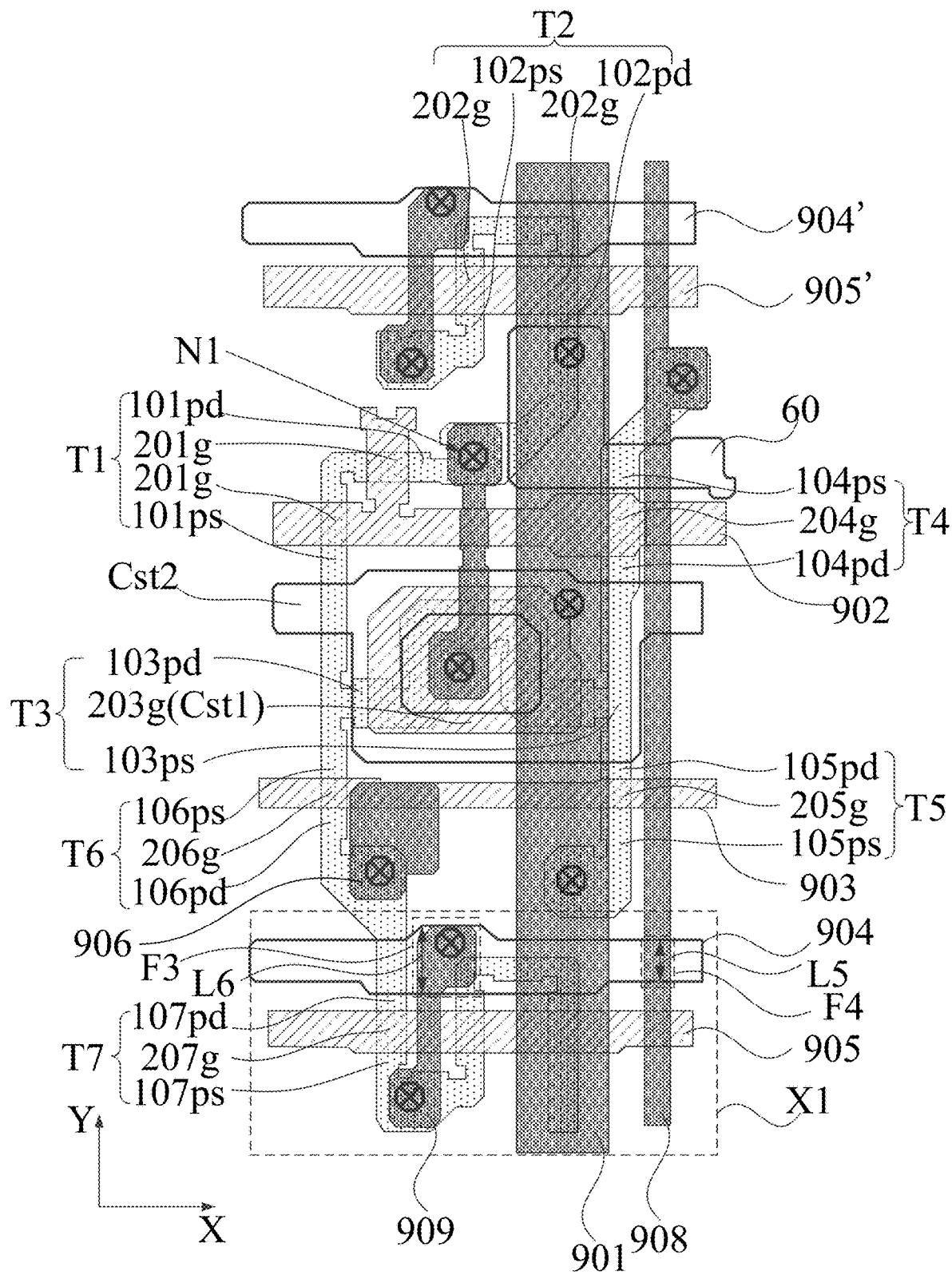
FIG. 15 is a third schematic layout view of a subpixel zone according to an embodiment of the present disclosure.
Figure 16:
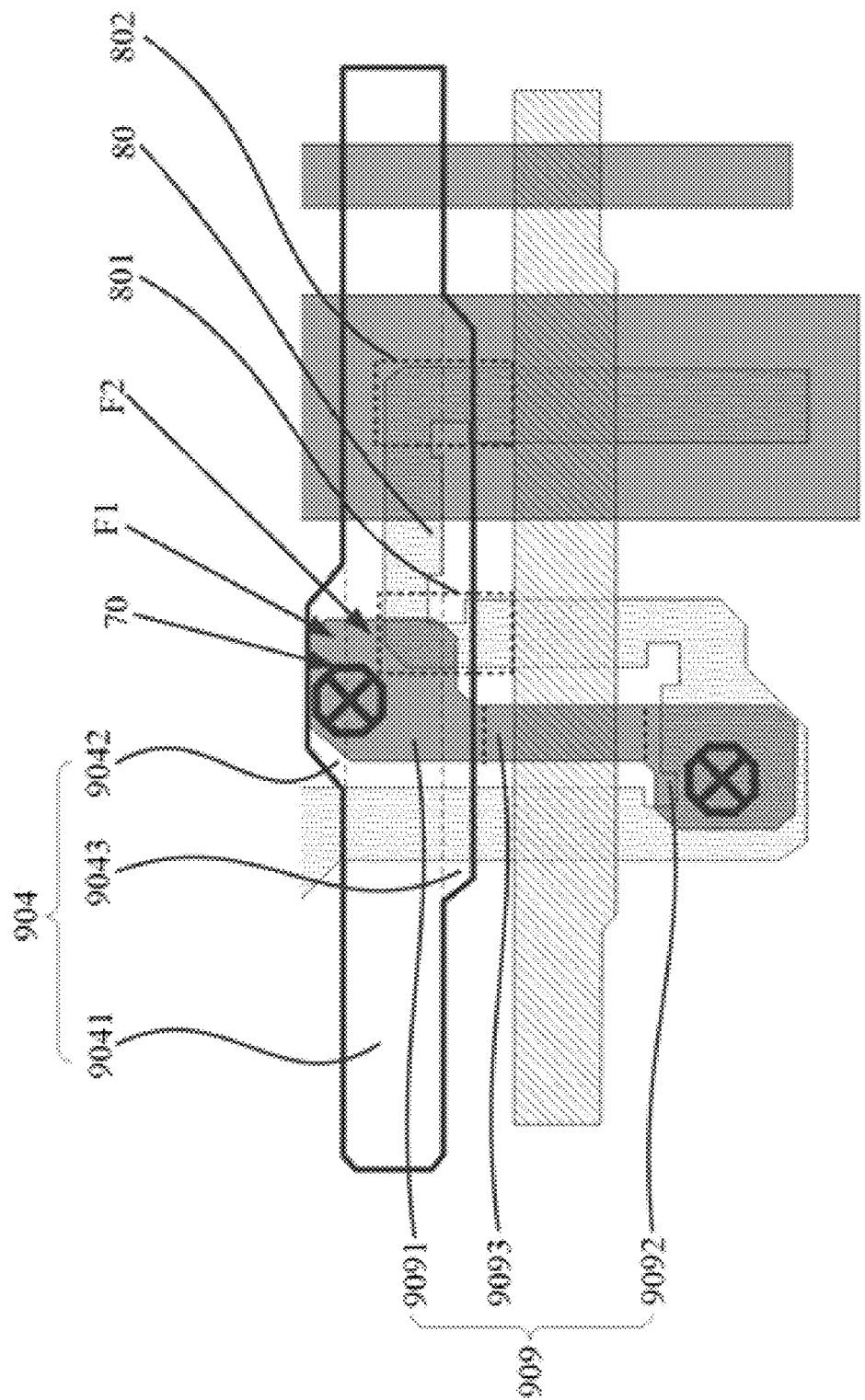
FIG. 16 is a first schematic enlarged view of the X1 portion in FIG. 15.

Referring to FIG. 15 and FIG. 16, an embodiment of the present disclosure provides a display panel. The display panel includes a base, and functional film layers disposed on the base. The display panel further includes a plurality of subpixel zones arranged in an array.

The functional film layer includes a reset signal line layer, an initialization signal line layer and a conductive connecting part layer.

The reset signal line layer includes a reset signal line pattern 905 disposed in each of the plurality of subpixel zones, the reset signal line pattern 905 extending along the first direction.

The initialization signal line layer includes an initialization signal line pattern 904 disposed in each of the plurality of subpixel zones. The initialization signal line pattern 904 includes a first body portion 9041 and a first protruding portion 904 coupled to each other. The first body portion 9041 extends along the first direction. In the same subpixel zone, the orthographic projection of the first body portion 9041 onto the base is between the orthographic projection of the first protruding portion 9042 onto the base and the orthographic projection of the reset signal line pattern 905 onto the base.

The conductive connecting part layer includes a conductive connecting part pattern 909 disposed in each of the plurality of subpixel zones. In the same subpixel zone, the orthographic projection of a first end portion 9091 of the conductive connecting part pattern 909 onto the base and the orthographic projection of the first protruding portion 9042 onto the base have a first overlapped region F1. In the first overlapped region F1, the first end portion 9091 is coupled to the first protruding portion 9042 and the second end portion 9092 of the conductive connecting part pattern 909 is coupled to the target coupling part in the subpixel zone where the conductive connecting part pattern is located. The orthographic projection of the reset signal line pattern 905 onto the base is between the orthographic projection of the target coupling part onto the base and the orthographic projection of the initialization signal line pattern 904 onto the base.

Specifically, the plurality of subpixel zones arranged in an array can be divided into a plurality of rows of subpixel zones arranged sequentially along a second direction and a plurality of columns of subpixel zones arranged sequentially along a first direction. Each row of subpixel zones includes a plurality of subpixel zones disposed in a spaced manner along the first direction, and each column of subpixel zones includes a plurality of subpixel zones disposed in a spaced manner along the second direction. The first direction intersects with the second direction. For example, the first direction includes the X direction and the second direction includes the Y direction.

The reset signal line layer includes a reset signal line pattern 905 disposed in each of the plurality of subpixel zones, the reset signal line pattern 905 extending along the first direction. The reset signal line patterns 905 are in a one-to-one correspondence with the subpixel zones. The reset signal line patterns 905 are in the corresponding subpixel zones, and the reset signal line patterns 905 corresponding to the subpixel zones in the same row are electrically connected sequentially to form an integral structure.

The initialization signal line layer includes an initialization signal line pattern 904 disposed in each of the plurality of subpixel zones. The initialization signal line patterns 904 are in a one-to-one correspondence with the subpixel zones. The initialization signal line patterns 904 are in the corresponding subpixel zones, and the initialization signal line patterns 904 corresponding to the subpixel zones in the same row are electrically connected sequentially to form an integral structure.

As shown in FIG. 16, each of the initialization signal line patterns 904 includes a first body portion 9041 and first protruding portion 9042 coupled to each other, the first body portion 9041 extending along the first direction. The first body portions 9041 in the initialization signal line patterns 904 corresponding to the subpixel zones in the same row are electrically connected sequentially to form an integral structure. It is noted that, in consideration of manufacture process error, the first body portion is not necessarily a linear one extending along the first direction.

The first protruding portion 9042 may have a variety of specific shapes, as long as the first protruding portion 9042 protrudes in the second direction from the first body portion 9041 to which the first protruding portion 9042 is coupled. It is provided, in the same subpixel zone, the orthographic projection of the first body portion 9041 onto the base is between the orthographic projection of the first protruding portion 9042 onto the base and the orthographic projection of the reset signal line pattern 905 onto the base, so that the first protruding portion 9042 can be disposed facing away from the reset signal line pattern 905. Thus, the first protruding portion 9042 can be spaced from the reset signal line pattern 905 by a large distance.

It is noted that in an initialization signal line pattern 904, the first body portion 9041 and the first protruding portion 9042 can form an integral structure, but not limitation is made in this respect.

The conductive connecting part layer includes a conductive connecting part pattern 909 disposed in each of the plurality of subpixel zones. The conductive connecting part patterns 909 are in a one-to-one correspondence with the subpixel zones, and the conductive connecting part patterns 909 are in the corresponding subpixel zones.

The orthographic projection of the first end portion 9091 of the conductive connecting part pattern 909 onto the base and the orthographic projection of the first protruding portion 9042 onto the base have a first overlapped region F1. The first end portion 9091 and the first protruding portion 9042 can be coupled via a hole (such as a first connecting hole 70) drilled in the first overlapped region F1. The second end portion 9092 of the conductive connecting part pattern 909 is coupled to the target coupling part in the subpixel zone where the conductive connecting part pattern is located. The target coupling part may include a first electrode of the seventh transistor corresponding to the current subpixel zone and a first electrode of a second transistor corresponding to the next subpixel zone adjacent to the current subpixel zone along the second direction.

The target coupling part may be disposed at a variety of positions. For example, it can be provided that, in the same subpixel zone, the orthographic projection of the reset signal line pattern 905 onto the base is between the orthographic projection of the target coupling part onto the base and the orthographic projection of the initialization signal line pattern 904 onto the base.

It is noted that the display panel further includes an interlayer dielectric layer (i.e., the second interlayer insulation layer ILD mentioned above). The interlayer dielectric layer is between the second gate metal layer and the first source-drain metal layer in the display panel. The initialization signal line pattern 904 and the second gate metal layer can be disposed on the same layer and formed in the same patterning process. The conductive connecting part pattern 909 and the first source-drain metal layer can be disposed on the same layer and formed in the same patterning process. The foregoing hole drilling in the first overlapped region F1 to couple the first end portion 9091 of the conductive connecting part pattern 909 to the first protruding portion 9042 manufactures a through hole penetrating the ILD layer. The position of the through hole is farther away from the reset signal line pattern 905.

As can be seen from the foregoing specific structure of the display panel, in a display panel according to an embodiment of the present disclosure, it is provided that the side of the initialization signal line pattern 904 facing away from the reset signal line pattern 905 includes a first protruding portion 9042, and that the orthographic projection of the first end portion 9091 of the conductive connecting part pattern 909 onto the base and the orthographic projection of the first protruding portion 9042 onto the base have a first overlapped region F1, and the first end portion 9091 and the first protruding portion 9042 can be coupled via a hole drilled in the first overlapped region F1. Such provision enables a relatively large distance between the through hole for coupling the conductive connecting part to the initialization signal line pattern 904 and the reset signal line pattern 905, so as to avoid the problem that in the process of hole drilling, the through hole tends to be mistakenly drilled onto the nearby reset signal line pattern 905 due to process fluctuation, which leads to signal disturbance, and consequently better ensure the yield of the display panel.

In addition, since it is provided that the side of the initialization signal line pattern 904 facing away from the reset signal line pattern 905 includes a first protruding portion 9042 and the through hole for coupling the conductive connecting part and the initialization signal line pattern 904 is formed in the first protruding portion 9042, the orthographic projection of the through hole onto the base can be enclosed by the orthographic projection of the initialization signal line pattern 904 onto the base. Thus, the reliability of the coupling between the initialization signal line pattern 904 and the conductive connecting part pattern 909 is significantly improved and consequently the operation stability of the display panel is better ensured.

As shown in FIG. 15 and FIG. 16, in some embodiments, the display panel further includes:
- a plurality of light-emitting elements in a one-to-one correspondence with the plurality of subpixel zones, wherein the plurality of light-emitting elements are on the side of the functional film layer facing away from the base;
- a plurality of subpixel driving circuits in a one-to-one correspondence with the plurality of subpixel zones, wherein each subpixel driving circuit includes a seventh transistor T7, the gate electrode 207g of the seventh transistor T7 is coupled to the corresponding reset signal line pattern 905, the first electrode of the seventh transistor T7 acts as the target coupling part, the second electrode (formed in the region 107pd) of the seventh transistor T7 extends along the second direction and is coupled to the anode of the corresponding light-emitting element;

The conductive connecting part pattern 909 further includes a second body portion 9093 connected between the first end portion 9091 and the second end portion 9092, the second body portion 9093 extending along the second direction; in the same subpixel zone, along the first direction, the first end portion 9091 of the conductive connecting part pattern 909 protrudes from the second body portion 9093 in the direction away from the second electrode of the seventh transistor.

Specifically, the display panel further includes a plurality of light-emitting elements on the side of the functional film layers facing away from the base, and the plurality of light-emitting elements are in a one-to-one correspondence with the plurality of subpixel zones. Each of the light-emitting elements includes an anode, a light-emitting pattern and a cathode sequentially disposed in a stacked manner in the direction away from the base. During operation, the display panel provides a driving signal to the anode and a common signal to the cathode, so that an electric field is generated between the anode and the cathode so as to control the light-emitting pattern to generate light of a corresponding color. For example, the light-emitting element includes a red light-emitting element that can emit red light, a green light-emitting element that can emit green light, a blue light-emitting element that can emit blue light, and the like.

The display panel further includes a plurality of subpixel driving circuits in a one-to-one correspondence with the plurality of subpixel zones. Each of the plurality of subpixel driving circuits is configured to provide a driving signal to the anode of its corresponding light-emitting element. For example, each of the subpixel driving circuits includes a seventh transistor. The gate electrode of the seventh transistor is coupled to the corresponding reset signal line pattern 905. The first electrode of the seventh transistor acts as the target coupling part. The target coupling part can be coupled to the corresponding initialization signal line pattern 904 through the corresponding conductive connecting part pattern 909. The second electrode of the seventh transistor T7 extends along the second direction and is coupled to the anode of the corresponding light-emitting element.

As shown in FIG. 6, the seventh transistor is primarily configured to reset an N2 node before pixel charging. The specific resetting process is as follows: the seventh transistor provides an initialization signal through the initialization signal line pattern 904 coupled to the conductive connecting part pattern 909, and the seventh transistor transfers the initialization signal to the N2 node to reset the N2 node. It is noted that, the conductive connecting part pattern 909 acts as an intermediate layer to enable wire jumping, and both the coupling between the conductive connecting part pattern 909 and the seventh transistor and the coupling between the conductive connecting part pattern 909 and the initialization signal line pattern 904 can be achieved through hole drilling.

The conductive connecting part pattern 909 has a variety of specific structures. For example, as shown in FIG. 16, the conductive connecting part pattern 909 further includes a second body portion 9093 connected between the first end portion 9091 and the second end portion 9092. The second body portion 9093 can extend along the second direction. In the same subpixel zone, along the first direction, the first end portion 9091 of the conductive connecting part pattern 909 protrudes from the second body portion 9093 in the direction away from the second electrode of the seventh transistor. Due to such a structure of the conductive connecting part pattern 909, there is a relatively large distance between the first end portion 9091 included in the conductive connecting part pattern 909 and the second electrode of the seventh transistor, so that when the through hole for coupling the first end portion 9091 of the conductive connecting part pattern 909 to the initialization signal line pattern 904 is formed in the ILD, the position of the formed through hole is farther away from the second electrode of the seventh transistor, so as to help to avoid the problem that during the manufacture process of the through hole, the through hole tends to be mistakenly drilled onto the second electrode of the seventh transistor due to process fluctuation, which leads to signal disturbance, and consequently better ensure the yield of the display panel.

More specifically, as shown in FIG. 15, the second electrode of the seventh transistor is manufactured from a poly-layer (i.e. an active layer), and the conductive connecting part pattern 909 is formed into the structure described above, so as to better avoid the problem that during the manufacture process of the through hole, the through hole tends to be mistakenly drilled onto the poly-layer corresponding to the second electrode of the seventh transistor due to process fluctuation, which leads to signal disturbance, and consequently better ensure the yield of the display panel.

As shown in FIG. 15, in some embodiments, the functional film layer further includes a data line pattern 908 in each of the plurality of subpixel zones, wherein the data line pattern 908 includes a portion extending along the second direction.

The orthographic projection of the initialization signal line pattern 904 onto the base and the orthographic projection of the conductive connecting part pattern 909 onto the base have a third overlapped region F3.

The orthographic projection of the initialization signal line pattern 904 onto the base and the orthographic projection of the data line pattern 908 onto the base have a fourth overlapped region F4.

The width L5 of the initialization signal line pattern 904 along the second direction in the fourth overlapped region F4 is less than the width L6 of the initialization signal line pattern 904 along the second direction in the third overlapped region F3.

Specifically, the data line patterns 908 are in a one-to-one correspondence with the subpixel zones. The data line patterns 908 are in the corresponding subpixel zones. The data line patterns 908 include a portion extending along the second direction, and the data line patterns 908 corresponding to the subpixel zones in the same column are electrically connected sequentially to form an integral structure.

As the data line pattern 908 extends along the second direction, the first body portion 9041 of the initialization signal line pattern 904 extends along the first direction, and the first direction intersects with the second direction, it is certain that the initialization signal line pattern 904 at least partially overlaps with the data line pattern 908 in the direction perpendicular to the base.

As described above, it is provided that the orthographic projection of the initialization signal line pattern 904 onto the base and the orthographic projection of the conductive connecting part pattern 909 onto the base have a third overlapped region F3, the orthographic projection of the initialization signal line pattern 904 onto the base and the orthographic projection of the data line pattern 908 onto the base have a fourth overlapped region F4, and the width of the initialization signal line pattern 904 along the second direction in the fourth overlapped region F4 is less than the width of the initialization signal line pattern 904 along the second direction in the third overlapped region F3, so that the initialization signal line pattern 904 can have a width along the second direction narrowed in some regions (specifically, the third overlapped region F3). Thus, not only the overlapped area between the initialization signal line pattern 904 and the data line pattern 908 can be reduced to reduce the parasitic capacitance value, but also the layout space for the initialization signal line pattern 904 can be effectively reduced, so that the pixel space can be saved, thereby facilitating development of high-resolution display panels.

Figure 17:
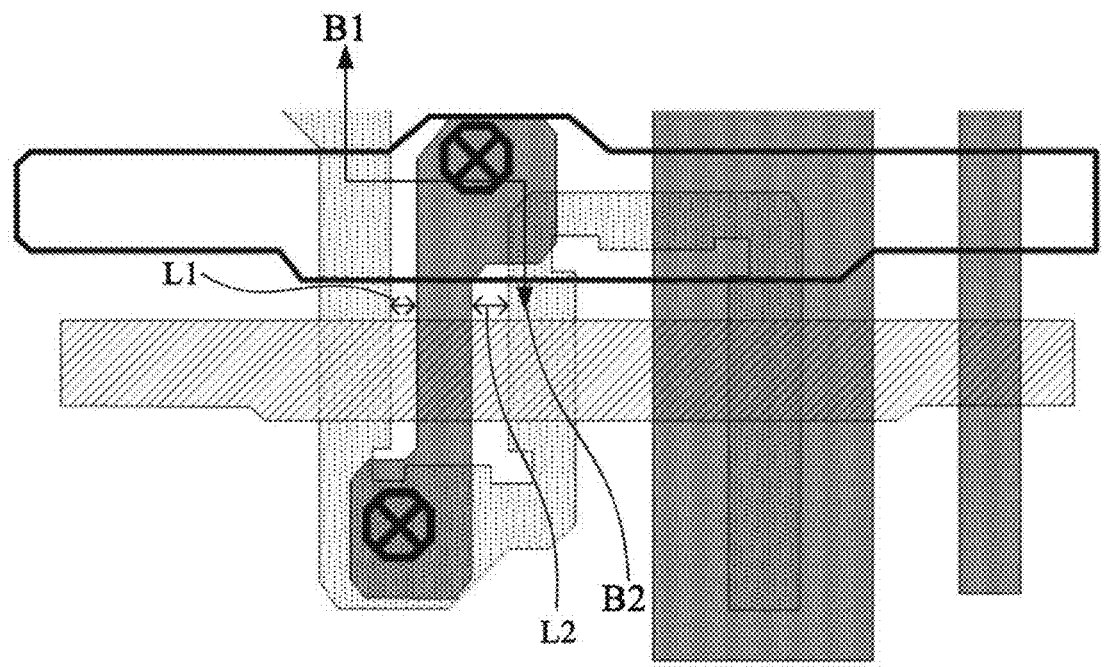
FIG. 17 is a second schematic enlarged view of the X1 portion in FIG. 15.

As shown in FIG. 15 to FIG. 17, in some embodiments, in the same subpixel zone, a first gap L1 exists between the orthographic projection of the second body portion 9093 onto the base and the orthographic projection of the second electrode of the seventh transistor T7 onto the base. The first gap is greater than a threshold value.

Specifically, as described above, it is provided that a first gap L1 exists between the orthographic projection of the second body portion 9093 onto the base and the orthographic projection of the second electrode of the seventh transistor T7 onto the base, so as to avoid the situation that the second body portion 9093 overlaps with the second electrode of the seventh transistor T7 in the direction perpendicular to the base.

In addition, it is provided that the first gap L1 is greater than a threshold value, so that there is a relatively large distance between the orthographic projection of the second body portion 9093 onto the base and the orthographic projection of the second electrode of the seventh transistor onto the base, thereby avoiding damaging the second electrode of the seventh transistor in the manufacture process of the second body portion 9093. It is noted that, the threshold value may be set according to practical needs. For example, the threshold value is between 8 μm and 35 μm, possibly endpoints inclusive.

Figure 19:
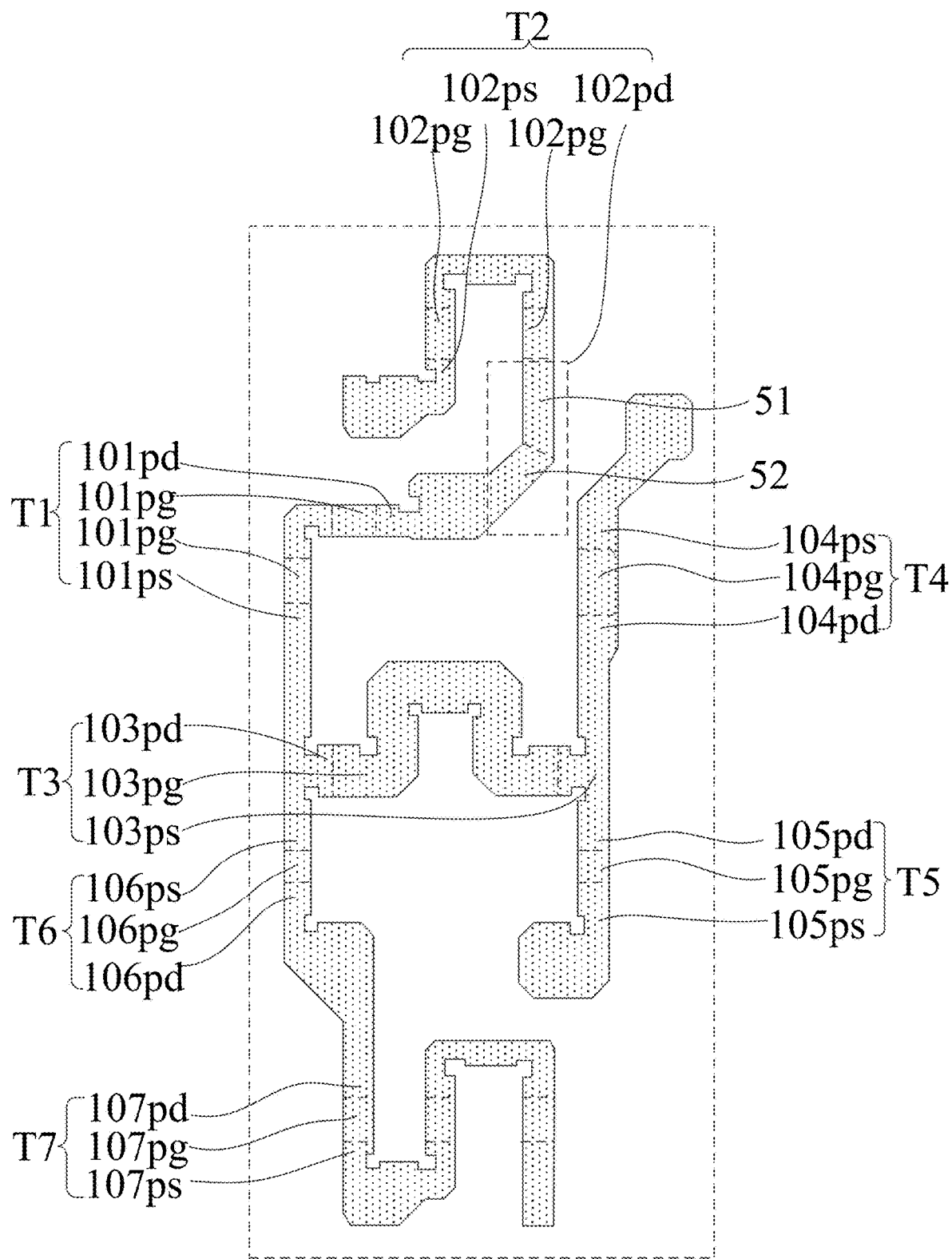
FIG. 19 is a schematic layout view of an active layer in FIG. 15.
Figure 20:
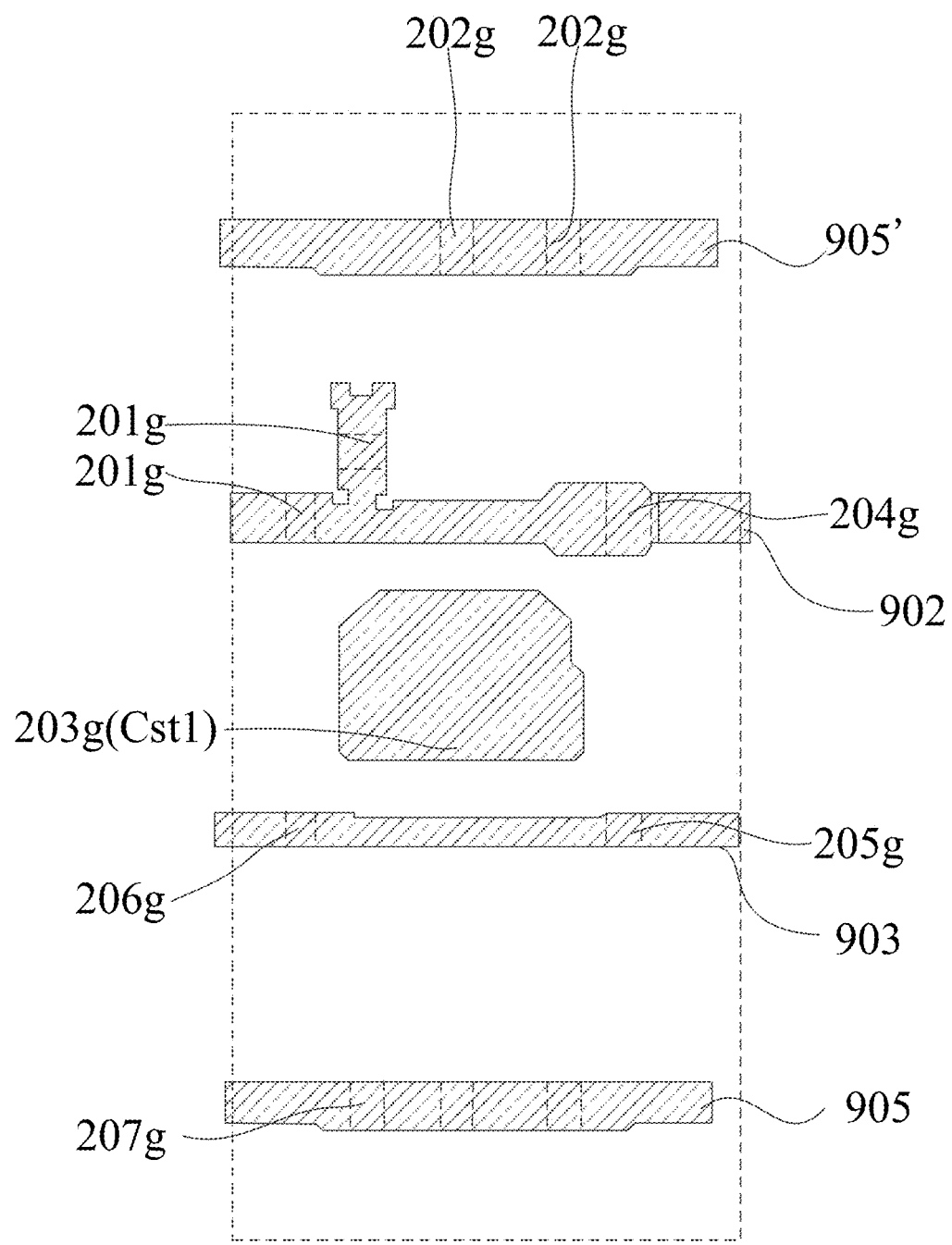
FIG. 20 is a schematic layout view of a first gate metal layer in FIG. 15.

As shown in FIG. 15 and FIG. 16, in some embodiments, the display panel further includes:
a plurality of subpixel driving circuits in a one-to-one correspondence with the plurality of subpixel zones, wherein each of the plurality of subpixel driving circuits includes a driving transistor and a second transistor T2;
the gate electrode 202g of the second transistor T2 is coupled to the reset signal line pattern 905' in the previous subpixel zone adjacent along the second direction, the first electrode of the second transistor T2 acts as the target coupling part in the previous subpixel zone, and the second electrode of the second transistor T2 is coupled to the gate electrode of the driving transistor (i.e., the third transistor T3);

The second transistor T2 includes two semiconductor portions (in the region labeled as 102pg, as shown in FIG. 19) disposed in a spaced manner along the first direction and a first conductor portion 80 connected to the two semiconductor portions, the orthographic projection of the first conductor portion 80 onto the base does not overlap with the orthographic projection of the first protruding portion 9042 in the previous subpixel zone onto the base.

Specifically, each of the subpixel driving circuits includes a driving transistor and a second transistor. The driving transistor is configured to generate a driving signal to drive the light-emitting element to emit light. The gate electrode of the second transistor is coupled to the reset signal line pattern 905 in the previous subpixel zone adjacent along the second direction. The first electrode of the second transistor acts as the target coupling part in the previous subpixel zone, and the second electrode of the second transistor is coupled to the gate electrode of the driving transistor. The second transistor is configured to, before pixel charging, transfer to an N1 node (coupled to the gate electrode of the driving transistor) the initialization signal provided by the initialization signal line pattern 904 coupled to the second transistor, so as to reset the N1 node.

For example, the second transistor is optionally of a dual-gate structure. Specifically, the second transistor includes two semiconductor portions disposed in a spaced manner along the first direction and a first conductor portion 80 connected to the two semiconductor portions. The two semiconductor portions each correspond to the channel region of the second transistor. The two semiconductor portions and the first conductor portion 80 may be formed into an integral structure. During manufacture, the two semiconductor portions and a third semiconductor portion corresponding to the first conductor portion 80 may be formed at first, then the third semiconductor portion is doped and formed into the first conductor portion 80.

As described above, it is provided that the orthographic projection of the first conductor portion 80 onto the base does not overlap with the orthographic projection of the first protruding portion 9042 in the previous subpixel zone onto the base, so that when the through hole for coupling the initialization signal line pattern 904 to the conductive connecting part pattern 909 is being formed, the problem that the through hole is mistakenly drilled onto the first conductor portion 80 due to process fluctuation, which leads to signal disturbance, may be better avoided, thereby better ensuring the yield of the display panel.

As shown in FIG. 15 and FIG. 16, in some embodiments, the orthographic projection of the first conductor portion 80 onto the base overlaps with the orthographic projection of the first end portion 9091 of the conductive connecting part pattern 909 in the previous subpixel zone onto the base.

Specifically, as described above, it is provided that the orthographic projection of the first conductor portion 80 onto the base overlaps with the orthographic projection of the first end portion 9091 of the conductive connecting part pattern 909 in the previous subpixel zone onto the base, so that not only the first end portion 9091 of the conductive connecting part pattern 909 can have a larger area to enclose the through hole for connecting the first end portion 9091 to the initialization signal line pattern 904, but also the first end portion 9091 of the conductive connecting part pattern 909 and the first conductor portion 80 have a more compact layout position. Thus, the pixel space can be saved, thereby facilitating development of high-resolution display panels.

As shown in FIG. 15 and FIG. 16, in some embodiments, each of the initialization signal line patterns 904 further includes a second protruding portion 9043 coupled to the first body portion 9041. In the same subpixel zone, the orthographic projection of the second protruding portion 9043 onto the base is between the orthographic projection of the first body portion 9041 onto the base and the orthographic projection of the reset signal line pattern 905 onto the base. The orthographic projection of the first conductor portion 80 onto the base overlaps with the orthographic projection of the second protruding portion 9043 and/or the first body portion 9041 onto the base.

Specifically, each of the initialization signal line patterns 904 may further include a second protruding portion 9043. Specifically, the second protruding portion 9043 may be located between the first body portion 9041 and the reset signal line pattern 905. For example, the second protruding portion 9043, the first protruding portion 9042 and the first body portion 9041 may be formed into an integral structure.

As described above, it is provided that the orthographic projection of the first conductor portion 80 onto the base overlaps with the orthographic projection of the second protruding portion 9043 and/or first body portion 9041 onto the base, so that the initialization signal line pattern 904 can shield the first conductor portion 80. As the initialization signals transmitted over the initialization signal line pattern 904 are all stable signals, such shielding can ensure the stability of signals on the first conductor portion 80 in the case that external data signal varies, so as to avoid the problem that when external data signal varies, the floating connection of the first conductor portion 80 causes instability of signals on the first conductor portion 80 through capacitance coupling effect.

As shown in FIG. 15 to FIG. 17, in some embodiments, the conductive connecting part pattern 909 further includes a second body portion 9093 connected between the first end portion 9091 and the second end portion 9092, the second body portion 9093 extending along the second direction.

An end 801 of the first conductor portion 80 that is close to the conductive connecting part pattern 909 in the previous subpixel zone extends along the second direction. A second gap L2 exists between the orthographic projection of the end 801 onto the base and the orthographic projection of a second body portion 9093 of the conductive connecting part pattern 909 onto the base. The second gap L2 is greater than a threshold value.

Specifically, the first conductor portion 80 may have a variety of shapes. For example, the first conductor portion 80 has a "H" shaped structure. That is, the end 801 of the first conductor portion 80 that is close to the conductive connecting part pattern 909 in the previous subpixel zone extends along the second direction, the end 802 of the first conductor portion 80 that is close to the power signal line pattern 901 extends along the second direction, and the portion of the first conductor portion 80 between these two ends extends along the first direction.

As described above, it is provided that a second gap L2 exists between the orthographic projection of the end 801 of the first conductor portion 80 that is close to the conductive connecting part pattern 909 in the previous subpixel zone onto the base and the orthographic projection of the second body portion 9093 of the conductive connecting part pattern 909 onto the base, so as to prevent the second body portion 9093 from overlapping with the first conductor portion 80 in the direction perpendicular to the base.

In addition, it is provided that the second gap L2 is greater than a threshold value, so that there is a relatively large distance between the orthographic projection of the second body portion 9093 onto the base and the orthographic projection of the first conductor portion 80 onto the base, thereby avoiding damaging the first conductor portion 80 during the manufacture process of the second body portion 9093. It is noted that the threshold value may be set according to practical needs. For example, the threshold value is between 8 μm and 35 μm, possibly endpoints inclusive.

As shown in FIG. 15 and FIG. 16, in some embodiments, in the same subpixel zone, the orthographic projection of the first end portion 9091 of the conductive connecting part pattern 909 onto the base and the orthographic projection of the first body portion 9041 of the initialization signal line pattern 904 onto the base further form a second overlapped region F2.

The functional film layers further include a first connecting hole 70 in each of the plurality of subpixel zones. In the same subpixel zone, the orthographic projection of the first connecting hole 70 onto the base overlaps with the first overlapped region F1 and the second overlapped region F2, and the first end portion 9091 of the conductive connecting part pattern 909 is coupled to the initialization signal line pattern 904 via the first connecting hole 70.

Specifically, the orthographic projection of the first end portion 9091 of the conductive connecting part pattern 909 onto the base and the orthographic projection of the first protruding portion 9042 of the initialization signal line pattern 904 onto the base may have a first overlapped region F1, and the orthographic projection of the first end portion 9091 of the conductive connecting part pattern 909 onto the base and the orthographic projection of the first body portion 9041 of the initialization signal line pattern 904 onto the base may have a second overlapped region F2.

When the first end portion 9091 of the conductive connecting part is coupled to the initialization signal line pattern 904 via the first connecting hole 70, it may be provided that the orthographic projection of the first connecting hole 70 onto the base overlaps with the first overlapped region F1 and the second overlapped region F2, so that there is a relatively large layout space for the first connecting hole 70, so as to ensure desirable performance of connection between the conductive connecting part pattern 909 and the initialization pattern.

Figure 18:
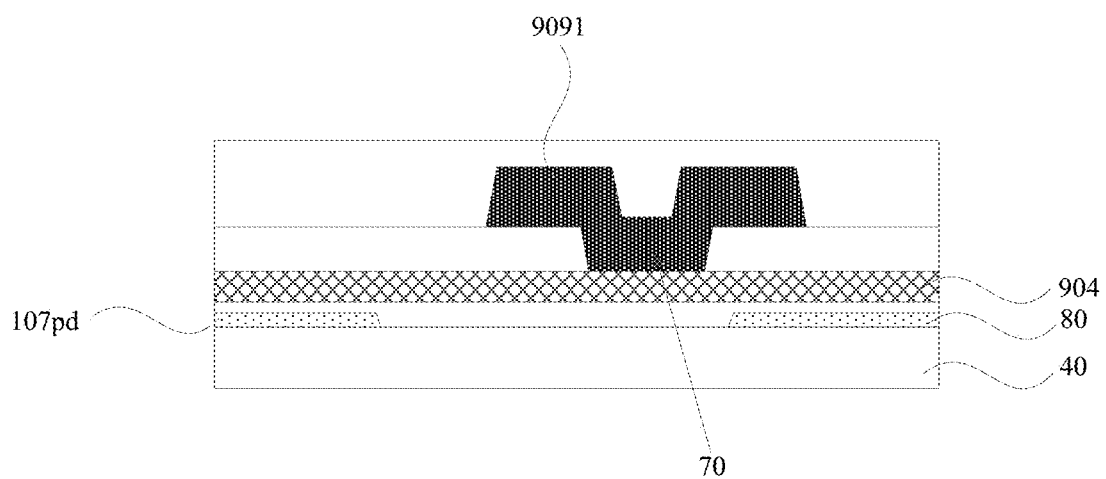
FIG. 18 is a schematic sectional view along the B1-B2 direction in FIG. 17.

As shown in FIG. 18, in some embodiments, the orthographic projection of the first conductor portion 80 of the second transistor T2 onto the base 40 does not overlap with the orthographic projection of the first connecting hole 70 in the previous subpixel zone onto the base 40.

Specifically, as described above, it is provided that the orthographic projection of the first conductor portion 80 of the second transistor onto the base 40 does not overlap with the orthographic projection of the first connecting hole 70 in the previous subpixel zone onto the base 40, so as to better avoid the problem that during manufacture of the first connecting hole, the through hole tends to be mistakenly drilled onto the first conductor portion 80 due to process fluctuation, which causes signal disturbance, thereby better ensuring the yield of the display panel.

As shown in FIG. 15 and FIG. 16, in some embodiments, the functional film layer further includes a power signal line layer. The power signal line layer includes a power signal line pattern 901 disposed in each of the plurality of subpixel zones. At least part of the power signal line pattern 901 extends along the second direction.

The end 802 of the first conductor portion 80 that is far away from the conductive connecting part pattern 909 in the previous subpixel zone extends along the second direction. The orthographic projection of the end 802 onto the base is entirely covered by the orthographic projection of the power signal line pattern 901 in the same subpixel zone onto the base.

Specifically, the power signal line patterns 901 are in a one-to-one correspondence with the subpixel zones, and the power signal line patterns 901 are in the corresponding subpixel zones. The power signal line patterns 901 disposed in each column of subpixel zones are sequentially coupled along the second direction and can form an integral structure.

As described above, it is provided that the end 802 of the first conductor portion 80 that is far away from the conductive connecting part pattern 909 in the previous subpixel zone extends along the second direction, and the orthographic projection of the end 802 onto the base is entirely covered by the orthographic projection of the power signal line pattern 901 in the same subpixel zone onto the base, so that the power signal line pattern 901 can shield the end of the first conductor portion 80 that is far away from the conductive connecting part pattern 909 in the previous subpixel zone. As the power signals transmitted over the power signal line pattern 901 are all stable signals, such shielding can ensure the stability of signals on the first conductor portion 80 in the case that external data signal varies, so as to avoid the problem that when external data signal varies, the floating connection of the first conductor portion 80 causes instability of signals on the first conductor portion 80 through capacitance coupling effect.

In addition, the provision described above effectively reduces the layout space occupied by the first conductive portion and the power signal line pattern 901 and reduces the size of the pixel structure, thereby facilitating development of high-resolution display panels.

Figure 22:
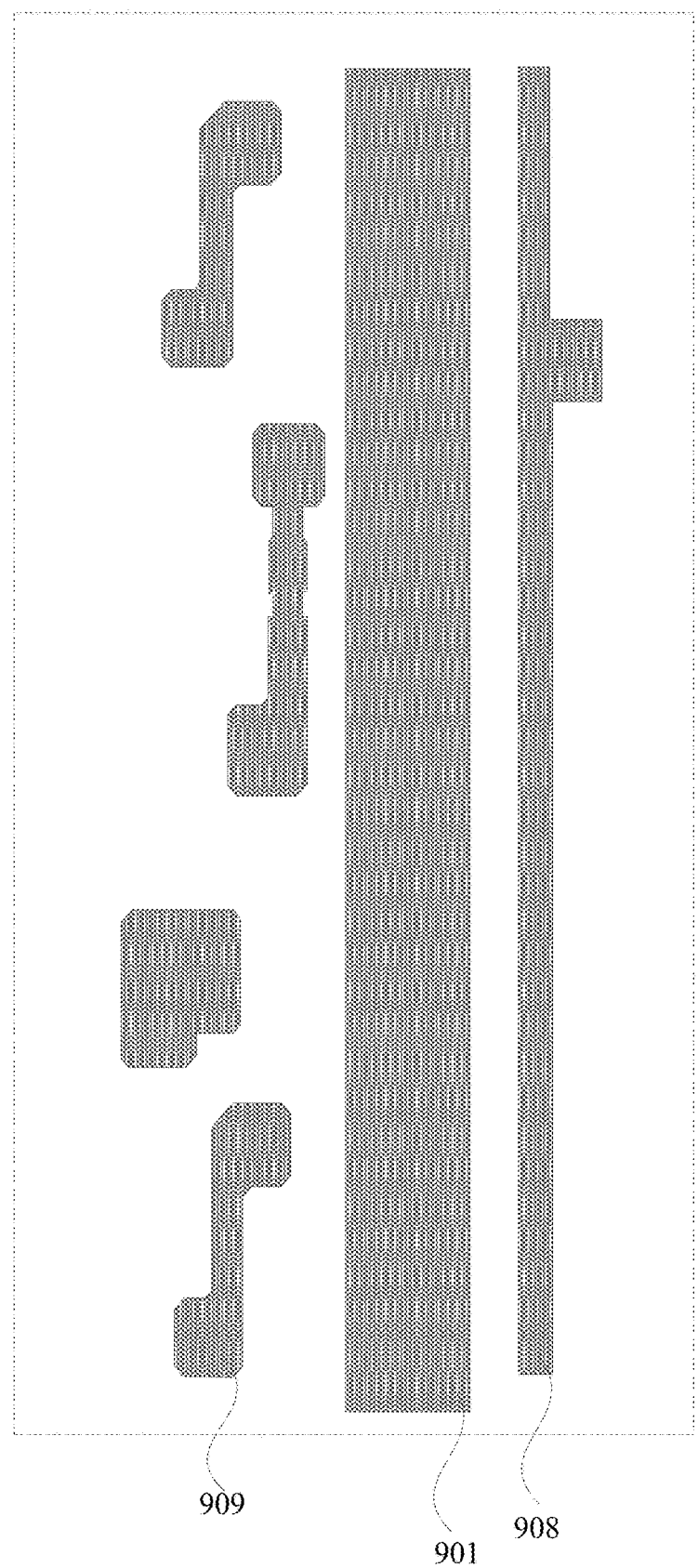
FIG. 22 is a schematic layout view of a source-drain metal layer in FIG. 15.

The power signal line pattern 901 may have a variety of structures, as shown in FIG. 22. In some embodiments, it may be provided that the power signal line pattern 901 extends along the second direction and has a substantially uniform width in a direction perpendicular to the second direction.

Figure 23:
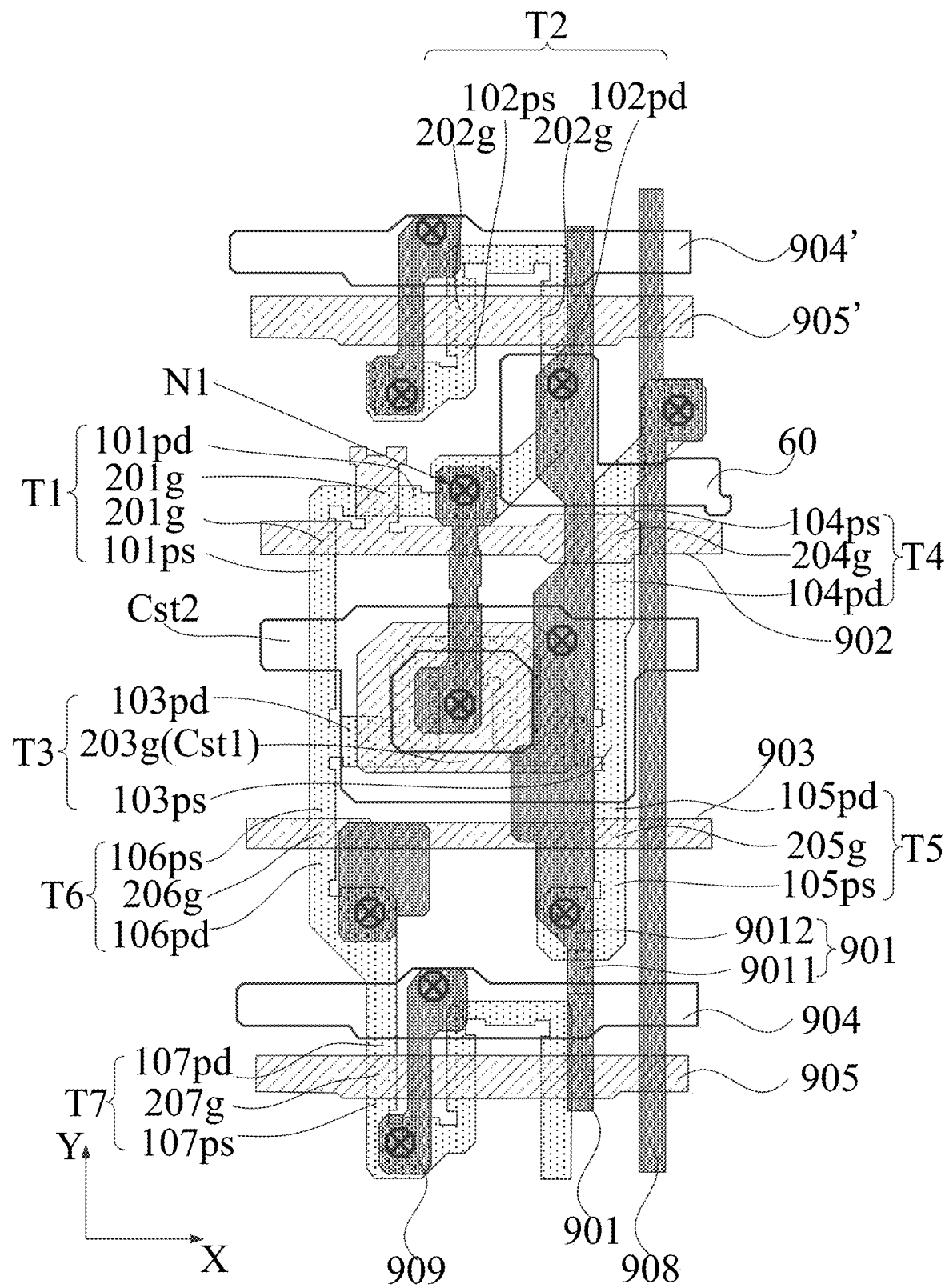
FIG. 23 is a fourth schematic layout view of a subpixel zone according to an embodiment of the present disclosure.
Figure 24:
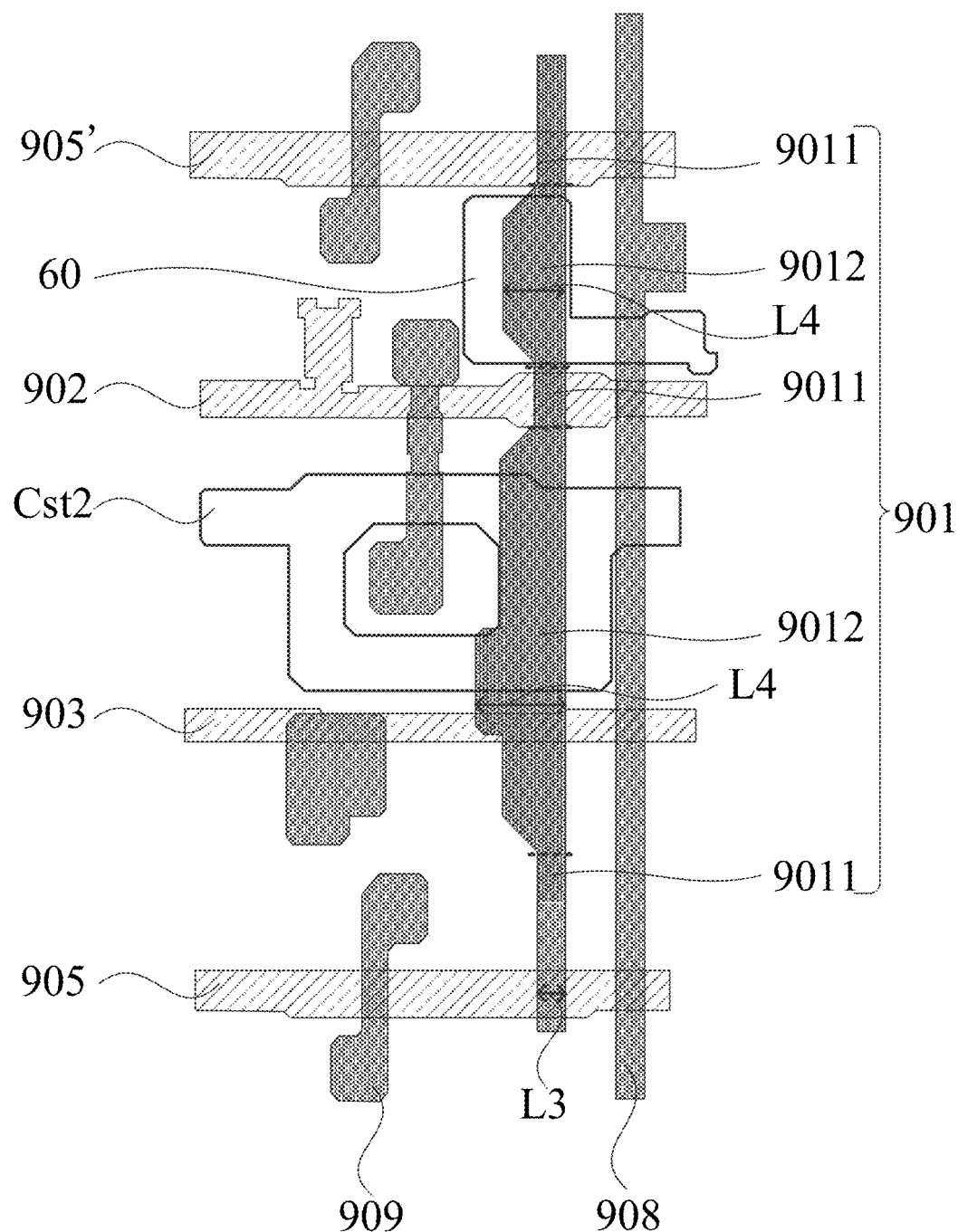
FIG. 24 is a schematic structural view of a power signal line pattern according to an embodiment of the present disclosure.

As shown in FIG. 23 and FIG. 24, in some other embodiments, the display panel further includes:

a plurality of subpixel driving circuits in a one-to-one correspondence with the plurality of subpixel zones, wherein each of the plurality of subpixel driving circuits includes a driving transistor and a storage capacitor, the storage capacitor includes a first electrode plate and a second electrode plate disposed opposite to each other, the first electrode plate also acts as the gate electrode of the driving transistor, the second electrode plate is on the side of the first electrode plate facing away from the base.

The functional film layers further include a power signal line layer. The power signal line layer includes a power signal line pattern 901 disposed in each of the plurality of subpixel zones. At least part of the power signal line pattern 901 extends along the second direction. The power signal line pattern 901 includes a first power portion 9011 and a second power portion 9012.

The orthographic projection of the first power portion 9011 onto the base overlaps with the orthographic projection of the reset signal line pattern 905 in the same subpixel zone onto the base, and overlaps with the orthographic projection of the gate line pattern 902 in the same subpixel zone onto the base. The orthographic projection of the second power portion 9012 onto the base overlaps with the orthographic projection of the second electrode plate Cts2 of the corresponding storage capacitor Cts onto the base. The width L3 of the first power portion 9011 is less than the width L4 of the second power portion 9012 along the first direction.

Specifically, each of the plurality of subpixel driving circuits may include a driving transistor and a storage capacitor Cts. The first electrode plate Cts1 of the storage capacitor Cts also acts as the gate electrode of the driving transistor to which the storage capacitor Cts is coupled. The second electrode plate Cts2 of the storage capacitor is on the side of the first electrode plate Cts1 facing away from the base, and the second electrode plate Cts2 and the first electrode plate can form an effective overlap area.

The power signal line pattern 901 may specifically include a first power portion 9011 and a second power portion 9012. For example, the first power portion 9011 and the second power portion 9012 are arranged alternately along the second direction, and the adjacent first portion and second portion are coupled together. For example, the first power portion 9011 and second power portion 9012 form an integral structure.

The first power portion 9011 and the second power portion 9012 may have a variety of specific layout positions. For example, it is provided that the orthographic projection of the first power portion 9011 onto the base overlaps with the orthographic projection of the reset signal line pattern 905 in the same subpixel zone onto the base, and overlaps with the orthographic projection of the gate line pattern 902 in the same subpixel zone onto the base; and the orthographic projection of the second power portion 9012 onto the base overlaps with the orthographic projection of the second electrode plate of the corresponding storage capacitor onto the base. As described above, it is provided that the width of the first power portion 9011 is less than the width of the second power portion 9012 along the first direction, so that the width of the first power portion 9011 along the first direction is effectively reduced, the overlapped area between the first power portion 9011 and the reset signal line pattern 905 is reduced and the overlapped area between the first power portion 9011 and the gate line pattern 902 is reduced, thereby effectively reducing the coupling capacitance generated between the power signal line pattern 901 and the reset signal line.

It is noted that the width of the first power portion 9011 along the first direction refers to the maximum distance or minimum distance between two opposite boundaries of the first power portion 9011 along the first direction. Similarly, the width of the second power portion 9012 along the first direction refers to the maximum distance or minimum distance between two opposite boundaries of the second power portion 9012 along the first direction.

Figure 25:
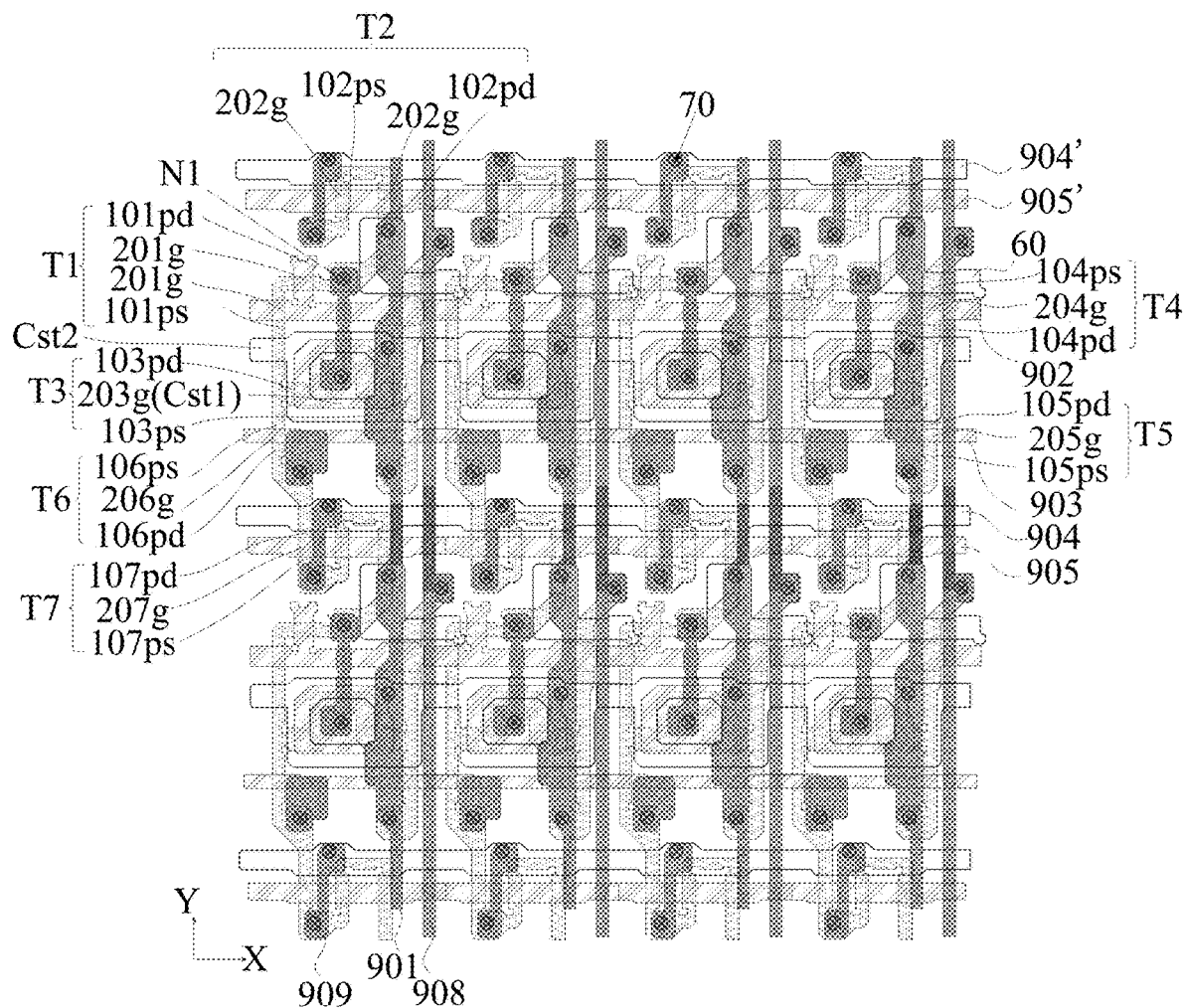
FIG. 25 is a fifth schematic layout view of a subpixel zone according to an embodiment of the present disclosure.

It is noted that FIG. 25 shows a schematic view of eight corresponding subpixel zones when the power signal line pattern 901 adopts a structure of the first power portion 9011 and the second power portion 9012. Although the first connecting hole 70 is shown in FIG. 25, this figure merely shows the approximate position for forming the first connecting hole, and the hole diameter of the first connecting hole actually manufactured may be larger than that shown in FIG. 25. The specific position for forming the first connecting hole may be in the overlapped region between the orthographic projection of the first end portion 9091 of the conductive connecting part pattern 909 onto the base and the orthographic projection of the initialization signal line pattern 904 onto the base.

Figure 26:
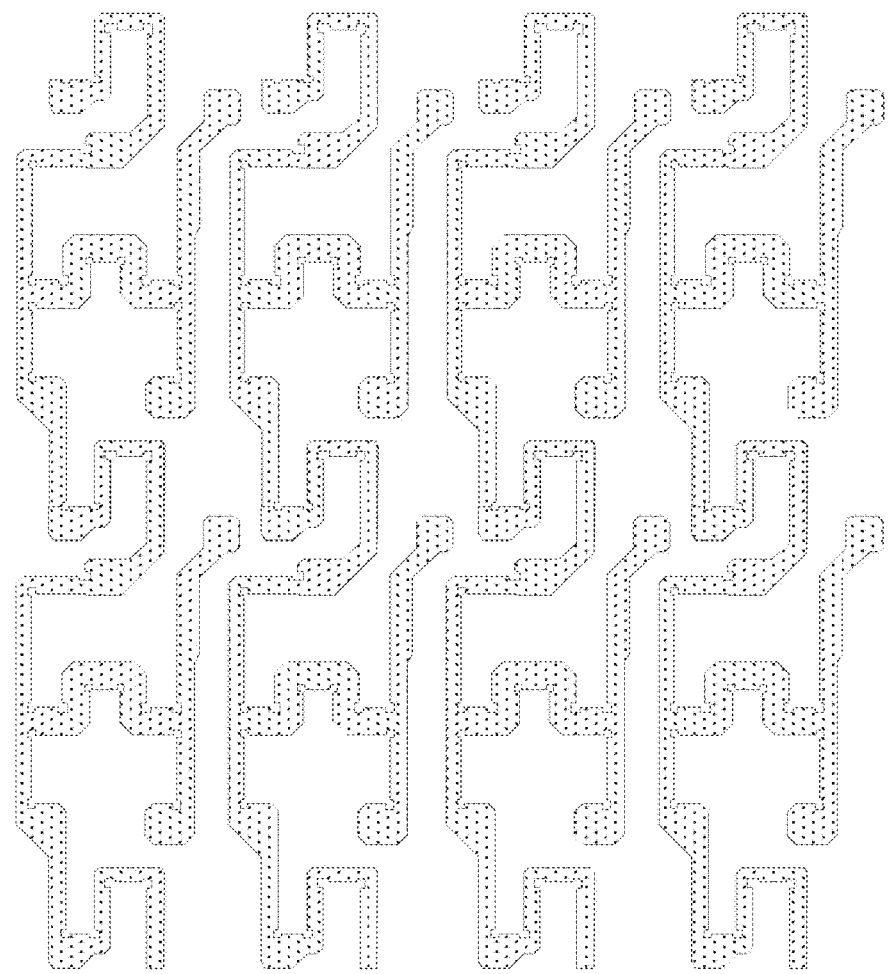
FIG. 26 is a schematic layout view of an active layer in FIG. 25.
Figure 27:
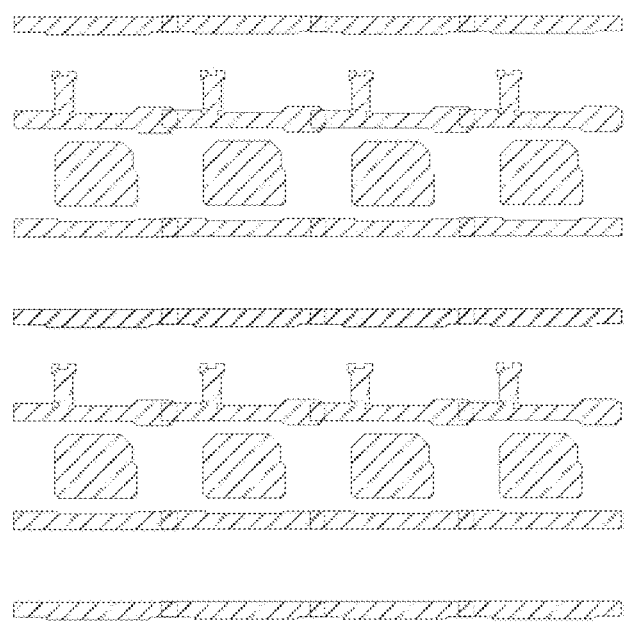
FIG. 27 is a schematic layout view of a first gate metal layer in FIG. 25.
Figure 28:
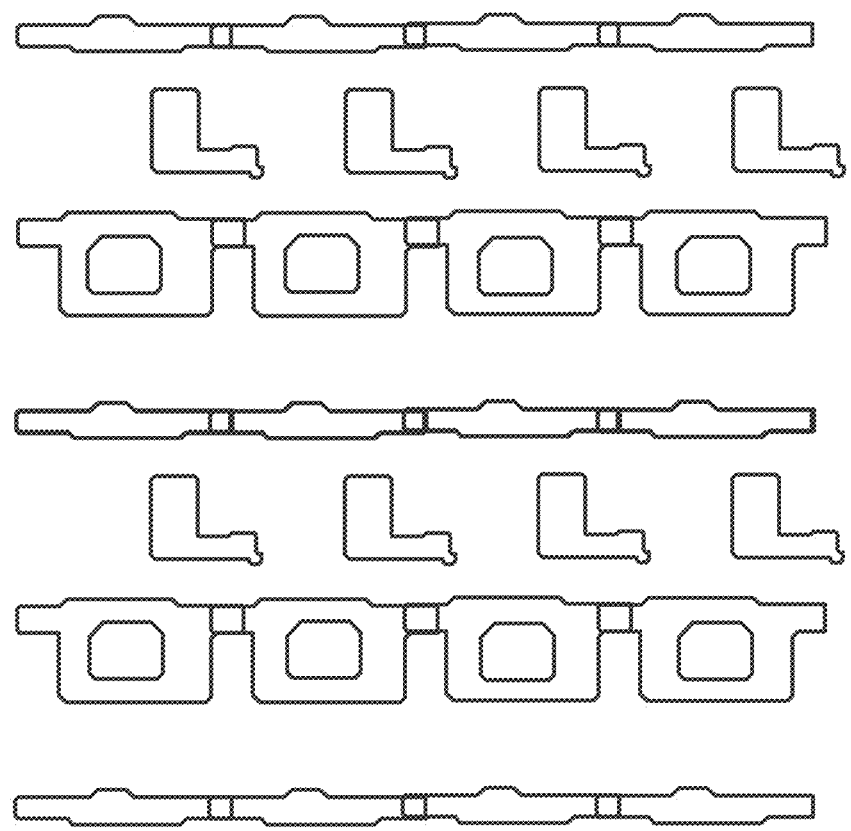
FIG. 28 is a schematic layout view of a second gate metal layer in FIG. 25.
Figure 29:
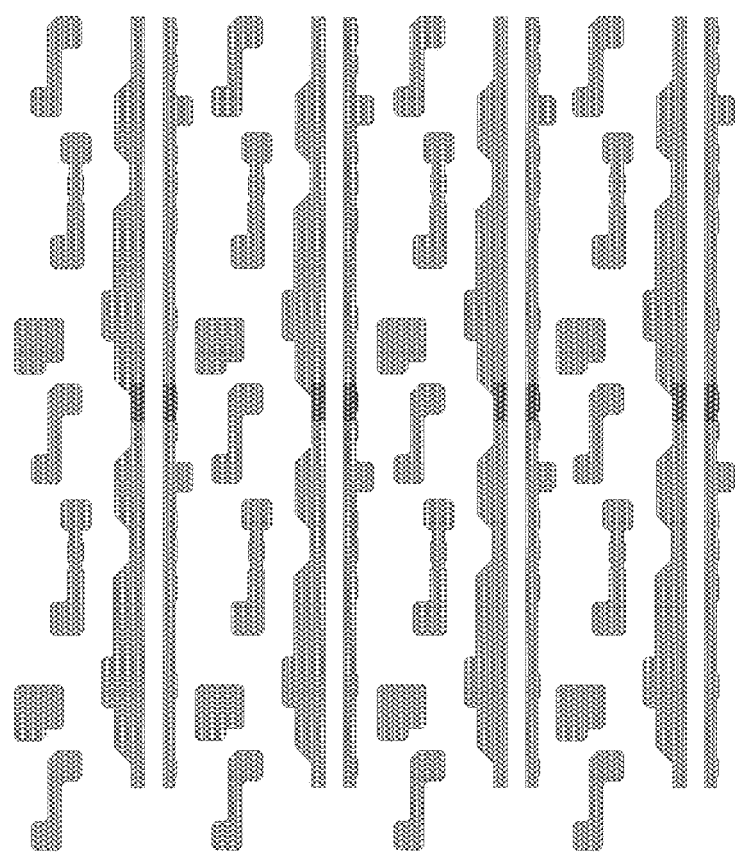
FIG. 29 is a schematic layout view of a source-drain metal layer in FIG. 25.
Figure 30:
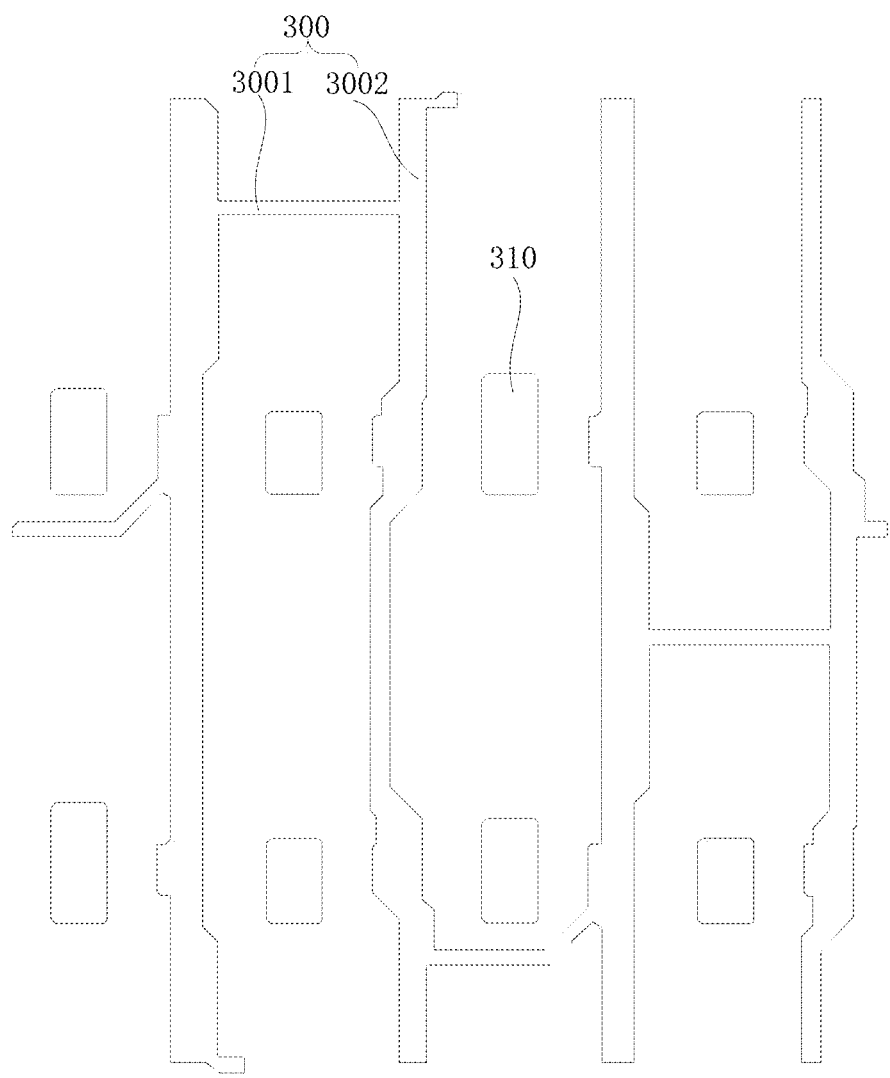
FIG. 30 is a schematic layout view of a second source-drain metal layer according to an embodiment of the present disclosure.

In addition, FIG. 26 is a schematic view of the active layer in FIG. 25, FIG. 27 is a schematic view of the first gate metal layer in FIG. 25, FIG. 28 is a schematic view of the second gate metal layer in FIG. 25, FIG. 29 is a schematic view of the first source-drain metal layer in FIG. 25, and FIG. 30 is a schematic view of eight subpixel zones corresponding to a second source-drain metal layer when the display panel includes the second source-drain metal layer.

Figure 31:
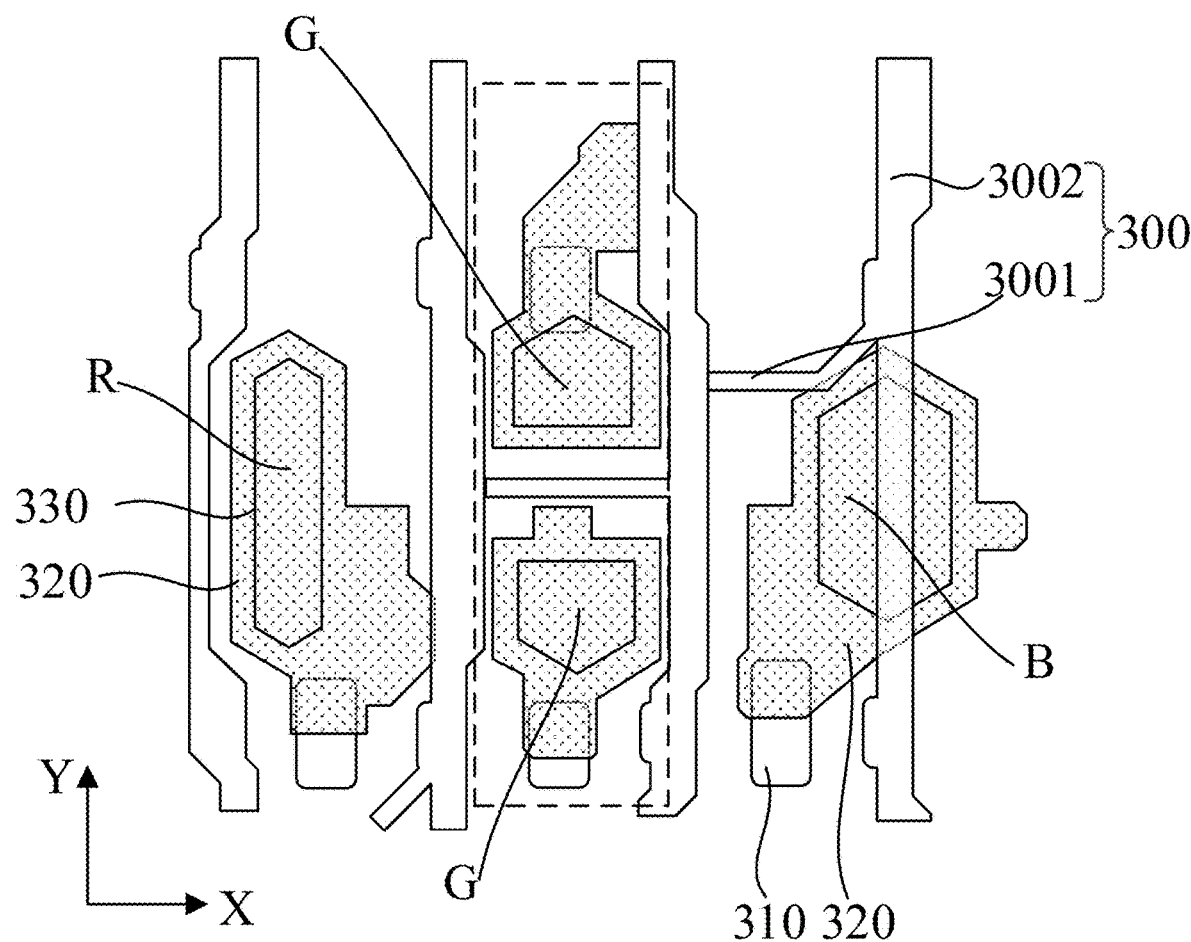
FIG. 31 is a schematic layout view of a second source-drain metal layer and an anode layer according to an embodiment of the present disclosure.

It is noted that, as shown in FIG. 30 and FIG. 31, the second source-drain metal layer may specifically include a power compensation pattern 300 and a switch-over pattern 310. The power compensation pattern 300 includes a lateral connecting part 3001 and a longitudinal connecting part 3002. The power compensation pattern 300 is coupled to the power signal line pattern included in the display panel to reduce the IR drop on the power signal line pattern. The switch-over patterns 310 are in a one-to-one correspondence with the anodes included in the display panel. The switch-over pattern 310 is configured to connect the corresponding anode 320 to the subpixel driving circuit for providing a driving signal to the anode 320.

Figure 34:
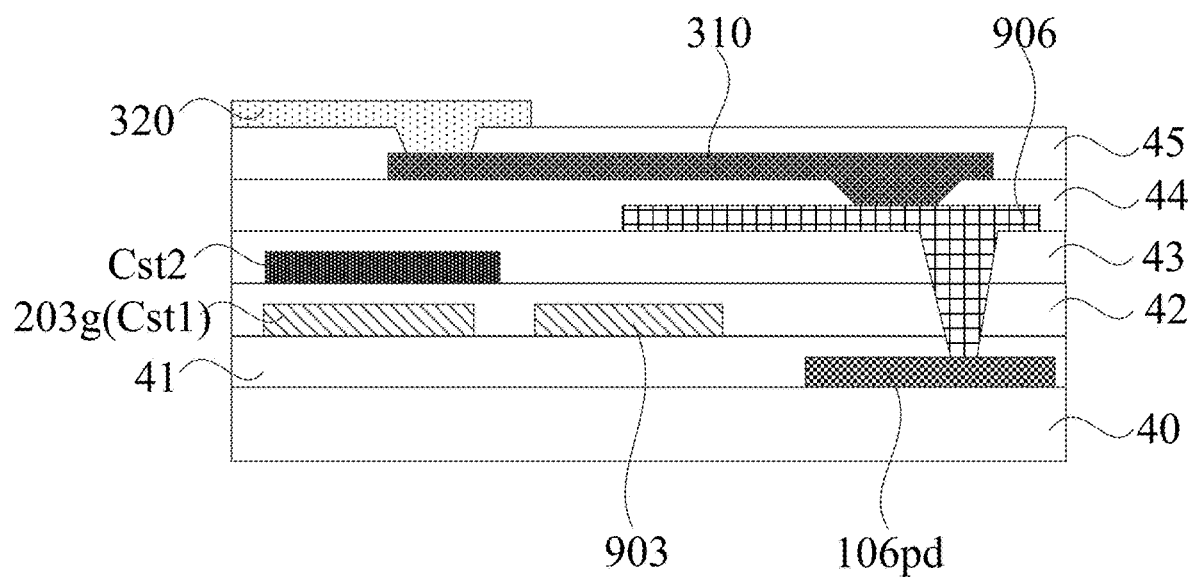
FIG. 34 is a schematic sectional view along the C1-C2 direction in FIG. 32.

In a specific embodiment, referring to FIG. 34, a second switch-over pattern 906 may further be disposed between the switch-over pattern 310 and the anode included in the display panel. The second switch-over pattern 906 is in the first source-drain metal layer.

It is noted that a passivation layer made of, for example, an inorganic material such as silicon nitride and silicon oxide, may be further provided on the first source-drain metal layer and/or second source-drain metal layer. No limitation is made in this respect in this embodiment.

Figure 32:
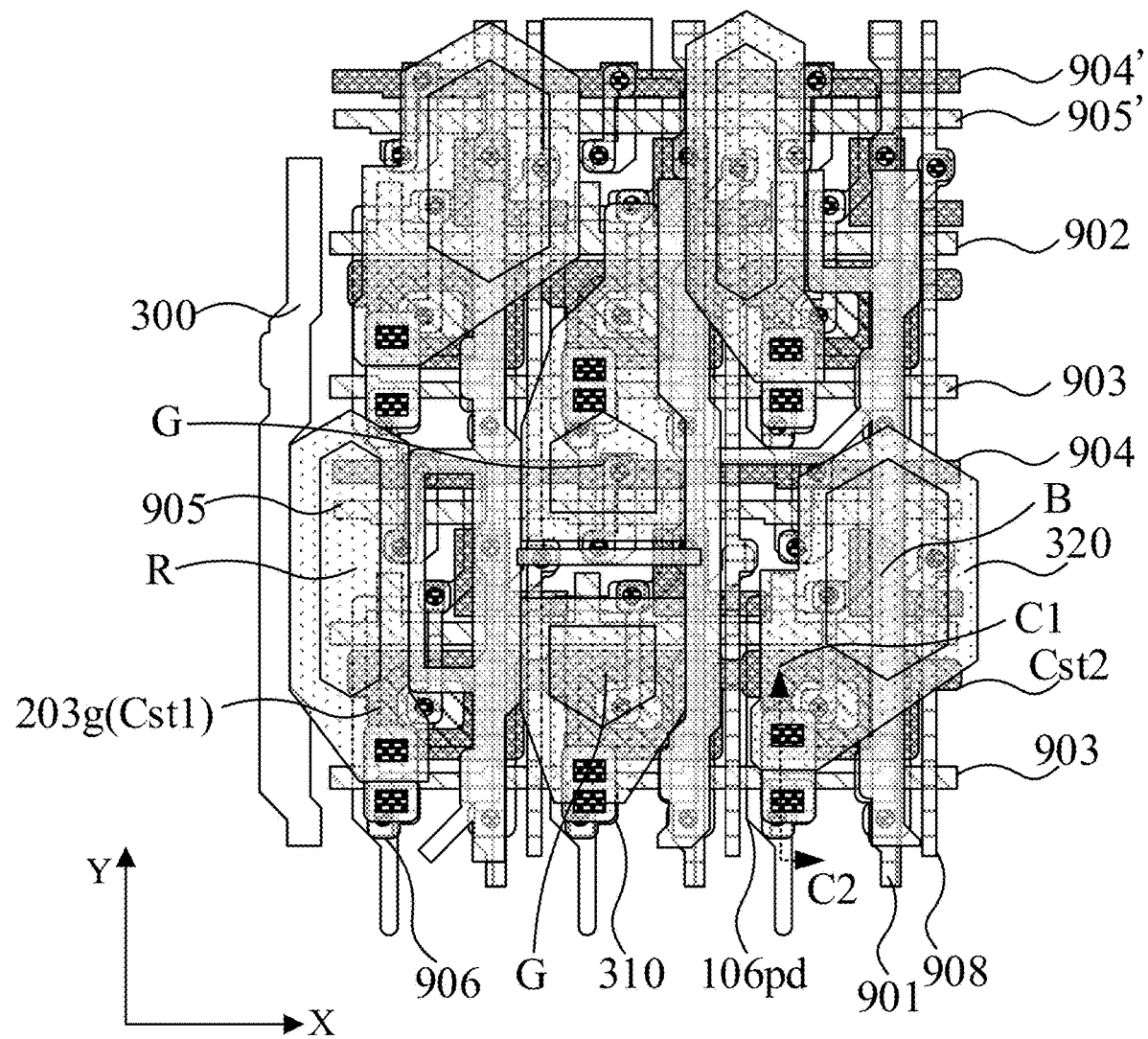
FIG. 32 is a sixth schematic layout view of a subpixel zone according to an embodiment of the present disclosure.

With continued reference to FIG. 30 to FIG. 32, the display panel further includes a pixel definition layer. The pixel definition layer forms pixel openings 330. The pixel opening 330 are in a one-to-one correspondence with the anodes 320. Each of the pixel opening 330 is used to reveal at least part of the corresponding anode 320. The organic light-emitting material layer included in the display panel is formed in each of the corresponding pixel openings 330.

It is noted that the display panel may include subpixels of various colors. The light-emitting elements corresponding to subpixels of different colors emit light of different colors. For example, each pixel unit in the display panel includes one red subpixel R, two green subpixels G and one blue subpixel B. FIG. 31 and FIG. 32 show the layout of various subpixel units of different colors in a pixel unit, i.e., a GGRB pixel arrangement.

Of course, the pixel unit in the display panel may also include one red subpixel R, one green subpixel G and one blue subpixel B. A pixel unit of such a structure may specifically adopt a strip RGB arrangement, that is, one red subpixel R, one green subpixel G and one blue subpixel B are arranged sequentially along the same direction (such as the X direction). Optionally, a pixel unit of such a structure may specifically adopt an RGB arrangement similar to an upside-down T shape. For example, the one red subpixel R and one blue subpixel B are positioned in the same row along the X direction, and the one green subpixel G is in another row along the X direction.

Figure 33:
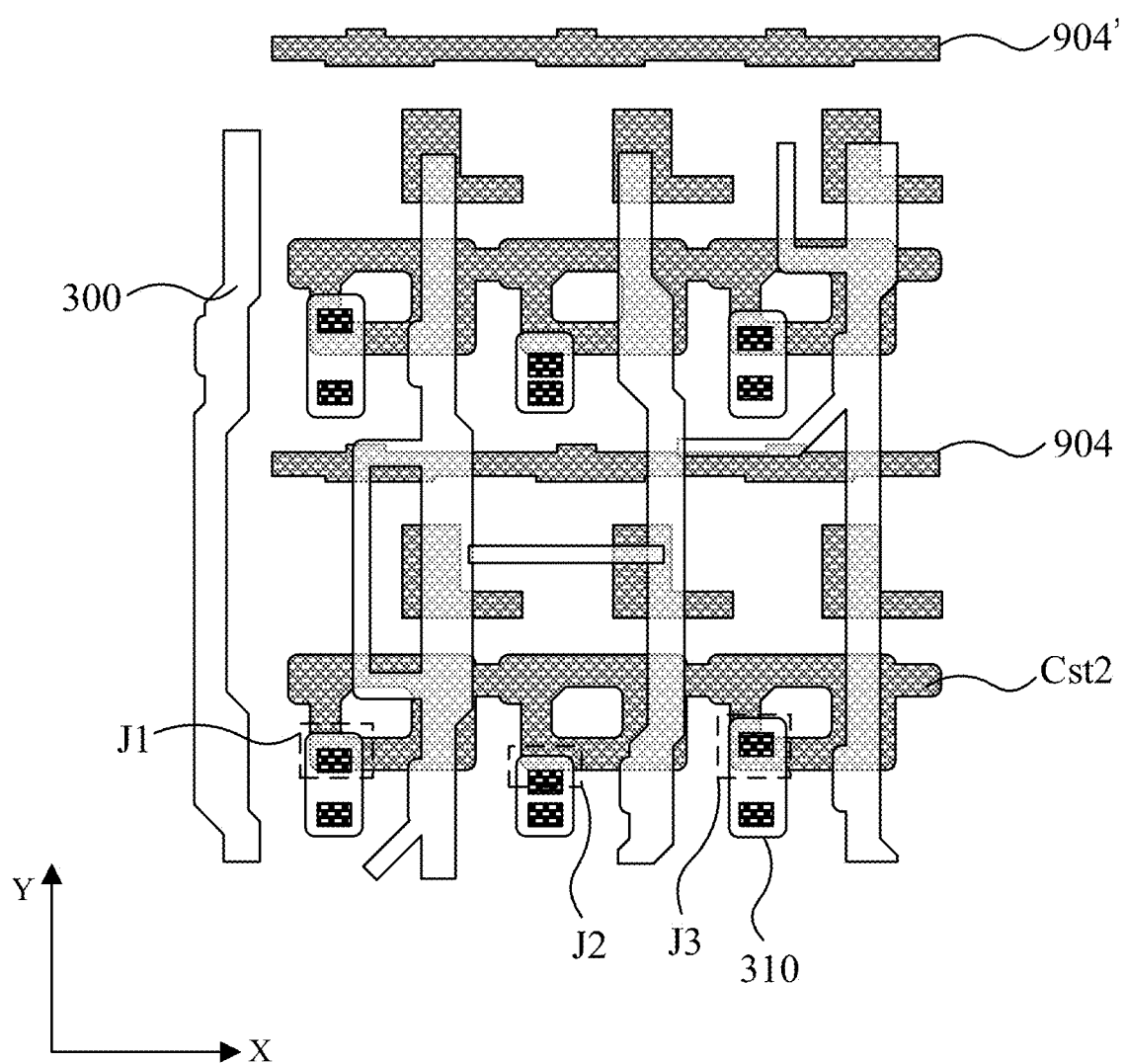
FIG. 33 is a schematic layout view of a second gate metal layer and a second source-drain metal layer in FIG. 32.

FIG. 33 shows the second gate metal layer and second source-drain metal layer corresponding to FIG. 32. In some embodiments, it may be provided that for subpixels of different colors, the orthographic projection of the switch-over pattern 310 onto the base and the orthographic projection of the second electrode plate Cst2 of the corresponding storage capacitor onto the base have different overlapped areas.

More specifically, referring to FIG. 32 and FIG. 33, for a red subpixel R, the orthographic projection of the switch-over pattern 310 onto the base and the orthographic projection of the second electrode plate Cst2 of the corresponding storage capacitor onto the base have a first overlapped area J1. For a green subpixel G, the orthographic projection of the switch-over pattern 310 onto the base and the orthographic projection of the second electrode plate Cst2 of the corresponding storage capacitor onto the base have a second overlapped area J2. For a blue subpixel B, the orthographic projection of the switch-over pattern 310 onto the base and the orthographic projection of the second electrode plate Cst2 of the corresponding storage capacitor onto the base have a third overlapped area J3. The second overlapped area J2 is less than the first overlapped area J1, and the first overlapped area J1 is less than the third overlapped area J3.

The provision described above enables better balance of the resistance-capacitance (RC) loading on the power signal line patterns 901 corresponding to pixel units of different colors.

Refer to FIG. 34, which is a sectional view along the C1-C2 direction of FIG. 32. Other film layers not shown in FIG. 34, such as a buffer layer, are also included between the base 40 and the sixth drain electrode formation region 106*pd* (i.e., the active layer in this region is used to form the drain electrode of the sixth transistor T6) in FIG. 34. FIG. 34 further shows a first gate insulation layer 41, a second gate insulation layer 42, an interlayer insulation layer 43, a first planarization layer 44 and a second planarization layer 45.

Figure 21:
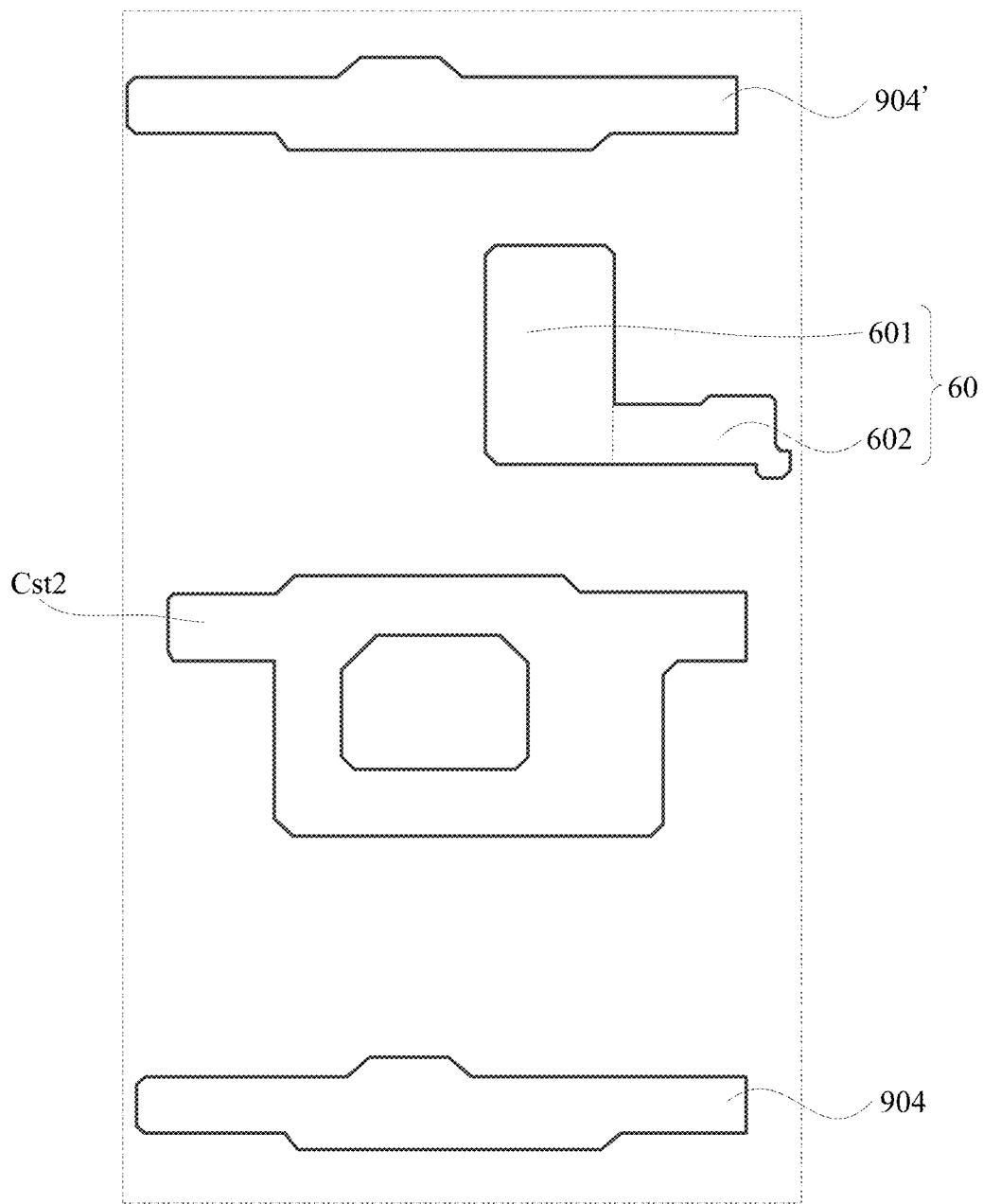
FIG. 21 is a schematic layout view of a second gate metal layer in FIG. 15.

As shown in FIG. 15 and FIG. 21, in some embodiments, the functional film layers further include a power signal line layer. The power signal line layer includes a power signal line pattern 901 disposed in each of the plurality of subpixel zones, and at least part of the power signal line pattern 901 extends along the second direction.

The functional film layers further include an auxiliary power layer. The auxiliary power layer includes an auxiliary power pattern 60 disposed in each of the plurality of subpixel zones. The orthographic projection of the auxiliary power pattern 60 onto the base and the orthographic projection of the power signal line pattern 901 in the same subpixel zone onto the base have an overlapped region, and the auxiliary power pattern 60 is coupled to the power signal line pattern 901 in the overlapped region.

Specifically, the auxiliary power patterns 60 are in a one-to-one correspondence with the subpixel zones. The auxiliary power patterns 60 are in the corresponding subpixel zones. For example, the auxiliary power pattern 60 and the second electrode plate of the storage capacitor may be made of the same material and disposed on the same layer. That is, they can be formed in the same patterning process.

In laying out the auxiliary power pattern 60, it may be provided that the orthographic projection of the auxiliary power pattern 60 onto the base and the orthographic projection of the power signal line pattern 901 in the same subpixel zone onto the base have an overlapped region. The auxiliary power pattern 60 can be coupled to the power signal line pattern 901 via a through hole provided in the overlapped region.

As described above, it is provided that the auxiliary power pattern 60 is coupled to the power signal line pattern 901, so as to desirably reduce the RC (resistance-capacitance) loading on the power signal line pattern 901 and reduce the IR drop (voltage drop) on the power signal line pattern 901, thereby better ensuring the operation stability of the display panel.

As shown in FIG. 15 and FIG. 19, in some embodiments, the display panel further includes a plurality of subpixel driving circuits in a one-to-one correspondence with the plurality of subpixel zones. Each of the plurality of subpixel driving circuits includes a driving transistor and a second transistor.

The gate electrode of the second transistor is coupled to the reset signal line pattern 905 in the previous subpixel zone adjacent along the second direction. The first electrode of the second transistor acts as the target coupling part in the previous subpixel zone. The second electrode of the second transistor includes a first electrode portion 51 and a second electrode portion 52 coupled to each other. The first electrode portion 51 extends along the second direction and the second electrode portion 52 extends along the third direction. The third direction intersects with both the first direction and the second direction. The first electrode portion 51 is between the semiconductor portion of the second transistor and the second electrode portion 52. The second electrode portion 52 is coupled to the gate electrode of the driving transistor.

The orthographic projection of the first electrode portion 51 onto the base and the orthographic projection of the second electrode portion 52 onto the base are both covered by the orthographic projection of the corresponding auxiliary power pattern 60 onto the base.

Specifically, the second electrode of the second transistor is configured to be coupled to the gate electrode of the driving transistor. For example, this second electrode may specifically include a first electrode portion 51 and a second electrode portion 52 coupled to each other. The first electrode portion 51 is between the semiconductor portion of the second transistor and the second electrode portion 52. The second electrode portion 52 is coupled to the gate electrode of the driving transistor.

The first electrode portion 51 and the second electrode portion 52 may have a variety of specific layouts. For example, the first electrode portion 51 extends along the second direction and the second electrode portion 52 extends along the third direction. The third direction intersects with both the first direction and the second direction. As described above, it is provided that the orthographic projection of the first electrode portion 51 onto the base and the orthographic projection of the second electrode portion 52 onto the base are both covered by the orthographic projection of the corresponding auxiliary power pattern 60 onto the base, so as to not only desirably ensure the electrical potential stability of the N1 node, but also effectively reduce the layout space to be occupied by the second electrode of the second transistor and the power signal line pattern 901, thereby desirably reducing the size of the pixel structure, and further facilitating development of high-resolution display panels.

As shown in FIG. 15 and FIG. 21, in some embodiments, the auxiliary power pattern 60 includes a first auxiliary sub-pattern 601 and a second auxiliary sub-pattern 602 coupled to each other. The first auxiliary sub-pattern 601 extends along the second direction and at least part of the second auxiliary sub-pattern 602 extends along the first direction. The orthographic projection of the first auxiliary sub-pattern 601 onto the base covers the orthographic projection of the first electrode portion 51 onto the base and the orthographic projection of the second electrode portion 52 onto the base.

Specifically, the auxiliary power pattern 60 may have a variety of specific structures. For example, the auxiliary power pattern 60 includes a first auxiliary sub-pattern 601 and a second auxiliary sub-pattern 602 coupled to each other. The first auxiliary sub-pattern 601 and the second auxiliary sub-pattern 602 may form an integral structure.

For example, the first auxiliary sub-pattern 601 extends along the second direction, and at least part of the second auxiliary sub-pattern 602 extends along the first direction, so that the auxiliary power pattern 60 is formed into a shape similar to "L".

As the auxiliary power pattern 60 is coupled to the power signal line pattern 901, the auxiliary power pattern 60 has a stable electrical potential. As described above, it is provided that the orthographic projection of the first auxiliary sub-pattern 601 onto the base covers the orthographic projection of the first electrode portion 51 onto the base and the orthographic projection of the second electrode portion 52 onto the base, so as to not only desirably ensure the electrical potential stability of the N1 node, but also effectively reduce the layout space to be occupied by the second electrode of the second transistor, the power signal line pattern 901 and the auxiliary power pattern 60, thereby desirably reducing the size of the pixel structure and further facilitating development of high-resolution display panels.

In some embodiments, the width of the first auxiliary sub-pattern 601 is greater than the width of the corresponding power signal line pattern 901 along the first direction.

As described above, it is provided that the width of the first auxiliary sub-pattern 601 is greater than the width of the corresponding power signal line pattern 901, so that the auxiliary power pattern 60 has a greater area, which not only facilitates the reduction of the IR drop of the power signal line pattern 901, but also facilitates coupling between the auxiliary power pattern 60 and the power signal line pattern 901.

As shown in FIG. 15, FIG. 19 and FIG. 22, in some embodiments, both the orthographic projection of the first electrode portion 51 onto the base and the orthographic projection of the second electrode portion 52 onto the base are covered by the orthographic projection of the corresponding power signal line pattern 901 onto the base.

As described above, it is provided that both the orthographic projection of the first electrode portion 51 onto the base and the orthographic projection of the second electrode portion 52 onto the base are covered by the orthographic projection of the corresponding power signal line pattern 901 onto the base, so as to not only desirably ensure the electrical potential stability of the N1 node, but also effectively reduce the layout space to be occupied by the second electrode of the second transistor and the power signal line pattern 901, thereby desirably reducing the size of the pixel structure and further facilitating development of high-resolution display panels.

In some embodiments, the functional film layers include a gate line pattern 902 and a light-emission control signal line pattern 903 in each of the plurality of subpixel zones. In the same subpixel zone, the gate line pattern 902, the light-emission control signal line pattern 903, the reset signal line pattern 905 and the initialization signal line pattern 904 are arranged sequentially along the second direction. The functional film layers further include a power signal line pattern 901 and a data line pattern 908 in each of the plurality of subpixel zones. The power signal line pattern 901 and the data line pattern 908 both include a portion extending along the second direction.

The display panel further includes light-emitting elements in a one-to-one correspondence with the plurality of subpixel zones and subpixel driving circuits in a one-to-one correspondence with the plurality of subpixel zones. Each of the plurality of subpixel driving circuits includes a driving transistor, a first transistor, a second transistor, a fourth transistor, a fifth transistor, a sixth transistor and a seventh transistor.

In the same subpixel zone, the gate electrode of the driving transistor is coupled to the second electrode of the first transistor, the first electrode of the driving transistor is coupled to the second electrode of the fifth transistor, the second electrode of the driving transistor is coupled to the first electrode of the first transistor, and the gate electrode of the first transistor is coupled to the gate line pattern 902.

The gate electrode of the second transistor is coupled to the reset signal line pattern 905 in the previous subpixel zone adjacent along the second direction, the first electrode of the second transistor acts as the target coupling part in the previous subpixel zone, and the second electrode of the second transistor is coupled to the gate electrode of the driving transistor.

The gate electrode of the fourth transistor is coupled to the gate line pattern 902, the first electrode of the fourth transistor is coupled to the data line pattern 908, and the second electrode of the fourth transistor is coupled to the first electrode of the driving transistor.

The gate electrode of the fifth transistor is coupled to the light-emission control signal line pattern 903, and the first electrode of the fifth transistor is coupled to the power signal line pattern 901.

The gate electrode of the sixth transistor is coupled to the light-emission control signal line pattern 903, the first electrode of the sixth transistor is coupled to the second electrode of the driving transistor, and the second electrode of the sixth transistor is coupled to the corresponding light-emitting element.

The second electrode of the seventh transistor is coupled to the light-emitting element, the gate electrode of the seventh transistor is coupled to the reset signal line pattern 905, and the first electrode of the seventh transistor is coupled to the second initialization signal line pattern 904.

For example, each of the plurality of subpixel driving circuits includes 7 thin film transistors and 1 capacitor. All the transistors included in the subpixel driving circuit are P-type. The driving transistor is the third transistor. The first electrode of each transistor is the source electrode and the second electrode of each transistor is the drain electrode.

As shown in FIG. 6, FIG. 15, FIG. 19 to FIG. 22, the first transistor T1 has a dual-gate structure, wherein the gate electrode 201g of the first transistor T1 is coupled to the gate line pattern 902, the source electrode S1 of the first transistor T1 is coupled to the drain electrode D3 of the third transistor T3 (i.e., the driving transistor), and the drain electrode D1 of the first transistor T1 is coupled to the gate electrode 203g of the third transistor T3.

The second transistor T2 has a dual-gate structure, wherein the gate electrode 202g of the second transistor T2 is coupled to the reset signal line pattern 905' in the previous subpixel zone adjacent along the second direction, the source electrode S2 of the second transistor T2 acts as the target coupling part in the previous subpixel zone and is coupled to the initialization signal line pattern 904' in the previous subpixel zone, and the drain electrode D2 of the second transistor T2 is coupled to the gate electrode 203g of the third transistor T3.

The gate electrode 204g of the fourth transistor T4 is coupled to the gate line pattern 902, the source electrode S4 of the fourth transistor T4 is coupled to the data line pattern 908, and the drain electrode D4 of the fourth transistor T4 is coupled to the source electrode S3 of the third transistor T3.

The gate electrode 205g of the fifth transistor T5 is coupled to the light-emission control signal line pattern 903, the source electrode S5 of the fifth transistor T5 is coupled to the power signal line pattern 901, and the drain electrode D5 of the fifth transistor T5 is coupled to the source electrode S3 of the third transistor T3.

The gate electrode 206g of the sixth transistor T6 is coupled to the light-emission control signal line pattern 903, the source electrode S6 of the sixth transistor T6 is coupled to the drain electrode D3 of the third transistor T3, and the drain electrode D6 of the sixth transistor T6 is coupled to the anode of the corresponding light-emitting element EL.

The gate electrode 207g of the seventh transistor T7 is coupled to the reset signal line pattern 905, the drain electrode D7 of the seventh transistor T7 is coupled to the anode of the corresponding light-emitting element EL, and the source electrode S7 of the seventh transistor T7 is coupled to the initialization signal line pattern 904.

The pixel driving circuit further includes a storage capacitor Cst. A first electrode plate Cst1 of the storage capacitor Cst also acts as the gate electrode 203g of the third transistor T3, and a second electrode plate Cst2 of the storage capacitor Cst is coupled to the power signal line pattern 901.

In the subpixel driving circuit according to the embodiment described above, not only it is possible to avoid the problem that in the process of hole drilling, the through hole tends to be mistakenly drilled onto the nearby reset signal line pattern 905 due to process fluctuation, which leads to signal disturbance, and consequently better ensure the yield of the display panel; but also the pixel structure using this subpixel driving circuit has a small size, which helps to achieve high-resolution of the display panel.

An embodiment of the present disclosure further provides a display device including a display panel according to the embodiments described above.

Since in the display panel of the foregoing embodiments according to the present disclosure, it is provided that the side of the initialization signal line pattern 904 facing away from the reset signal line pattern 905 includes a first protruding portion 9042, and that the orthographic projection of the first end portion 9091 of the conductive connecting part pattern 909 onto the base and the orthographic projection of the first protruding portion 9042 onto the base have a first overlapped region F1, and the first end portion 9091 can be coupled to the first protruding portion 9042 via a hole drilled in the first overlapped region F1, there is a relatively large distance between the through hole for coupling the conductive connecting part to the initialization signal line pattern 904 and the reset signal line pattern 905, such that the problem that in the process of hole drilling, the through hole tends to be mistakenly drilled onto the nearby reset signal line pattern 905 due to process fluctuation, which leads to signal disturbance, is avoided and consequently the yield of the display panel is better ensured.

In addition, since it is provided that the side of the initialization signal line pattern 904 facing away from the reset signal line pattern 905 includes a first protruding portion 9042, and the through hole for coupling the conductive connecting part and the initialization signal line pattern 904 is formed in the first protruding portion 9042, the orthographic projection of the through hole onto the base can be enclosed by the orthographic projection of the initialization signal line pattern 904 onto the base. Thus, the reliability of the coupling between the initialization signal line pattern 904 and the conductive connecting part pattern 909 is significantly improved and consequently the operation stability of the display panel is better ensured.

Therefore, when including the display panel described above, the display device according to an embodiment of the present disclosure also has the foregoing beneficial effects, which shall not be described again here.

It is noted that the display device may be any product or component has a display function, such as a TV, display, digital photo frame, mobile phone, tablet computer.

An embodiment of the present disclosure further provides a manufacture method of a display panel. The method is used for manufacturing the display panel according to the embodiments described above, and includes: manufacturing functional film layers on a base and forming a plurality of subpixel zones arranged in an array.

The functional film layers include a reset signal line layer, an initialization signal line layer and a conductive connecting part layer.

The reset signal line layer includes a reset signal line pattern 905 disposed in each of the plurality of subpixel zones, the reset signal line pattern 905 extending along the first direction.

The initialization signal line layer includes an initialization signal line pattern 904 disposed in each of the plurality of subpixel zones. The initialization signal line pattern 904 includes a first body portion 9041 and a first protruding portion 9042 coupled to each other. The first body portion 9041 extends along the first direction. In the same subpixel zone, the orthographic projection of the first body portion 9041 onto the base is between the orthographic projection of the first protruding portion 9042 onto the base and the orthographic projection of the reset signal line pattern 905 onto the base.

The conductive connecting part layer includes a conductive connecting part pattern 909 disposed in each of the plurality of subpixel zones. In the same subpixel zone, the orthographic projection of the first end portion 9091 of the conductive connecting part pattern 909 onto the base and the orthographic projection of the first protruding portion 9042 onto the base have a first overlapped region F1. In this first overlapped region F1, the first end portion 9091 is coupled to the first protruding portion 9042. The second end portion 9092 of the conductive connecting part pattern 909 is coupled to the target coupling part in the subpixel zone where the conductive connecting part pattern is located. The orthographic projection of the reset signal line pattern 905 onto the base is between the orthographic projection of the target coupling part onto the base and the orthographic projection of the initialization signal line pattern 904 onto the base.

Specifically, the plurality of subpixel zones arranged in an array can be divided into a plurality of rows of subpixel zones arranged sequentially along a second direction and a plurality of columns of subpixel zones arranged sequentially along a first direction. Each row of subpixel zones includes a plurality of subpixel zones disposed in a spaced manner along the first direction, and each column of subpixel zones includes a plurality of subpixel zones disposed in a spaced manner along the second direction. The first direction intersects with the second direction. For example, the first direction includes the X direction and the second direction includes the Y direction.

The reset signal line layer includes a reset signal line pattern 905 disposed in each of the plurality of subpixel zones, the reset signal line pattern 905 extending along the first direction. The reset signal line patterns 905 are in a one-to-one correspondence with the subpixel zones, the reset signal line patterns 905 are in the corresponding subpixel zones, and the reset signal line patterns 905 corresponding to the subpixel zones in the same row are electrically connected sequentially to form an integral structure.

The initialization signal line layer includes an initialization signal line pattern 904 disposed in each of the plurality of subpixel zones. The initialization signal line patterns 904 are in a one-to-one correspondence with the subpixel zones. The initialization signal line patterns 904 are in the corresponding subpixel zones, and the initialization signal line patterns 904 corresponding to the subpixel zones in the same row are electrically connected sequentially to form an integral structure.

Each of the initialization signal line patterns 904 includes a first body portion 9041 and a first protruding portion 9042 coupled to each other, the first body portion 9041 extending along the first direction. The first body portions 9041 of the initialization signal line patterns 904 corresponding to the subpixel zones in the same row are electrically connected sequentially to form an integral structure. It is noted that, in consideration of manufacture process error, the first body portion is not necessarily a linear one extending along the first direction.

The first protruding portion 9042 may have a variety of specific shapes, as long as the first protruding portion 9042 protrudes in the second direction from the first body portion 9041 to which the first protruding portion 9042 is coupled. It is provided, in the same subpixel zone, the orthographic projection of the first body portion 9041 onto the base is between the orthographic projection of the first protruding portion 9042 onto the base and the orthographic projection of the reset signal line pattern 905 onto the base, so that the first protruding portion 9042 can be disposed facing away from the reset signal line pattern 905. Thus, the first protruding portion 9042 can be spaced from the reset signal line pattern 905 by a large distance.

It is noted that in an initialization signal line pattern 904, the first body portion 9041 and the first protruding portion 9042 can form an integral structure, but not limitation is made in this respect.

The conductive connecting part layer includes a conductive connecting part pattern 909 disposed in each of the plurality of subpixel zones. The conductive connecting part patterns 909 are in a one-to-one correspondence with the subpixel zones, and the conductive connecting part patterns 909 are in the corresponding subpixel zones.

The orthographic projection of the first end portion 9091 of the conductive connecting part pattern 909 onto the base and the orthographic projection of the first protruding portion 9042 onto the base have a first overlapped region F1. The first end portion 9091 and the first protruding portion 9042 can be coupled via a hole drilled in the first overlapped region F1. The second end portion 9092 of the conductive connecting part pattern 909 is coupled to the target coupling part in the subpixel zone where the conductive connecting part pattern is located. The target coupling part may include a first electrode of the seventh transistor corresponding to the current subpixel zone and a first electrode of a second transistor corresponding to the next subpixel zone adjacent to the current subpixel zone along the second direction.

The target coupling part may be disposed at a variety of positions. For example, it can be provided that, in the same subpixel zone, the orthographic projection of the reset signal line pattern 905 onto the base is between the orthographic projection of the target coupling part onto the base and the orthographic projection of the initialization signal line pattern 904 onto the base.

It is noted that the display panel further includes an interlayer dielectric layer (i.e., the second interlayer insulation layer ILD mentioned above). The interlayer dielectric layer is between the second gate metal layer and the first source-drain metal layer in the display panel. The initialization signal line pattern 904 and the second gate metal layer can be disposed on the same layer and formed in the same patterning process. The conductive connecting part pattern 909 and the first source-drain metal layer can be disposed on the same layer and formed in the same patterning process. The foregoing hole drilling in the first overlapped region F1 to couple the first end portion 9091 of the conductive connecting part pattern 909 to the first protruding portion 9042 manufactures a through hole penetrating the ILD layer. The position of the through hole is farther away from the reset signal line pattern 905.

In a display panel manufactured by using the manufacture method according to the embodiment of the present disclosure, it is provided that the side of the initialization signal line pattern 904 facing away from the reset signal line pattern 905 includes a first protruding portion 9042 and that the orthographic projection of the first end portion 9091 of the conductive connecting part pattern 909 onto the base and the orthographic projection of the first protruding portion 9042 onto the base have a first overlapped region F1, and the first end portion 9091 and the first protruding portion 9042 can be coupled via a hole drilled in the first overlapped region F1, such that there is a relatively large distance between the through hole for coupling the conductive connecting part to the initialization signal line pattern 904 and the reset signal line pattern 905, so as to avoid the problem that in the process of hole drilling, the through hole tends to be mistakenly drilled onto the nearby reset signal line pattern 905 due to process fluctuation, which leads to signal disturbance, and consequently better ensure the yield of the display panel.

In addition, since it is provided that the side of the initialization signal line pattern 904 facing away from the reset signal line pattern 905 includes the first protruding portion 9042 and the through hole for coupling the conductive connecting part and the initialization signal line pattern 904 is formed in the first protruding portion 9042, the orthographic projection of the through hole onto the base can be enclosed by the orthographic projection of the initialization signal line pattern 904 onto the base. Thus, the reliability of the coupling between the initialization signal line pattern 904 and the conductive connecting part pattern 909 is significantly improved and consequently the operation stability of the display panel is better ensured.

It is noted that the embodiments in this specification are described in a progressive manner, and for the same and similar parts among the embodiments, references can be made to each other. Each embodiment focuses on the differences from other embodiments. Particularly, for the method embodiment, as it is essentially similar to the product embodiment, the description is relatively simple. For relevant aspects, reference may be made to some description of the product embodiment.

Unless otherwise defined, technical terms or scientific terms used in the present disclosure shall have the general meaning understood by those with ordinary skills in the field to which the present disclosure belongs. As used in the present disclosure, "first", "second" and similar words do not indicate any order, quantity or importance, but are merely intended to distinguish different components. Similar words such as "includes" or "including" mean that the elements or objects appearing before the word encompass the elements or objects listed after the word and their equivalents, but do not exclude other elements or objects. Similar words such as "connection", "coupling" or "connected" are not limited to physical or mechanical connection, but can include electrical connection, whether direct or indirect. Terms "Upper", "lower", "left" and "right" or the like are merely intended to express the relative positional relationship. When the absolute position of the described object changes, the relative positional relationship may change accordingly.

It can be understood that when an element such as a layer, film, region or base is referred to as being "on" or "under" another element, the element may be directly "on" or "under" another element, or there may be an intervening element.

In the description of the embodiments above, specific features, structures, materials or characteristics may be combined in any one or more embodiments or examples in a suitable manner.

Described above are merely specific embodiments of the present disclosure, but the scope of the present disclosure is not limited thereto. Any changes or substitutions easily occurring to a person skilled in the art without departing from the technical scope disclosed in the present disclosure should fall within the scope of the present disclosure. Therefore, the scope of the present disclosure shall be defined by the scope of the claims.

What is claimed is:

1. A display panel, comprising: a base, and functional film layers disposed on the base, wherein the display panel further comprises a plurality of subpixel zones arranged in an array;

the functional film layers comprise: a reset signal line layer, an initialization signal line layer, and a conductive connecting part layer;

the reset signal line layer comprises a reset signal line pattern disposed in each of the plurality of subpixel zones, the reset signal line pattern extends along a first direction;

the initialization signal line layer comprises an initialization signal line pattern disposed in each of the plurality of subpixel zones, the initialization signal line pattern comprises a first body portion and a first protruding portion coupled to each other, the first body portion extends along the first direction, and in the same subpixel zone, an orthographic projection of the first body portion onto the base is between an orthographic projection of the first protruding portion onto the base and an orthographic projection of the reset signal line pattern onto the base; and the conductive connecting part layer comprises a conductive connecting part pattern disposed in each of the plurality of subpixel zones, in the same subpixel zone, an orthographic projection of the first end portion of the conductive connecting part pattern onto the base and the orthographic projection of the first protruding portion onto the base have a first overlapped region, in the first overlapped region, the first end portion is coupled to the first protruding portion and a second end portion of the conductive connecting part pattern is coupled to a target coupling part in the subpixel zone where the conductive connecting part pattern is located, the orthographic projection of the reset signal line pattern onto the base is between an orthographic projection of the target coupling part onto the base and an orthographic projection of the initialization signal line pattern onto the base.

2. The display panel according to claim 1, further comprising:

a plurality of light-emitting elements in a one-to-one correspondence with the plurality of subpixel zones, wherein the plurality of light-emitting elements are positioned on a side of the functional film layer facing away from the base; and a plurality of subpixel driving circuits in a one-to-one correspondence with the plurality of subpixel zones, wherein each of the plurality of subpixel driving circuits comprises a seventh transistor, a gate electrode of the seventh transistor is coupled to the corresponding reset signal line pattern, a first electrode of the seventh transistor acts as the target coupling part, a second electrode of the seventh transistor extends along a second direction and is coupled to an anode of the corresponding light-emitting element;

the conductive connecting part pattern further comprises a second body portion connected between the first end portion and the second end portion, the second body portion extends along the second direction; in the same subpixel zone, along the first direction, the first end portion of the conductive connecting part pattern protrudes from the second body portion in a direction away from the second electrode of the seventh transistor.

3. The display panel according to claim 2, wherein the functional film layers further comprise a data line pattern in each of the plurality of subpixel zones, the data line pattern comprises a portion that extends along the second direction;
the orthographic projection of the initialization signal line pattern onto the base and an orthographic projection of the conductive connecting part pattern onto the base have a third overlapped region; and
the orthographic projection of the initialization signal line pattern onto the base and an orthographic projection of the data line pattern onto the base have a fourth overlapped region;
a width of the initialization signal line pattern along the second direction in the fourth overlapped region is less than a width of the initialization signal line pattern along the second direction in the third overlapped region.

4. The display panel according to claim 2, wherein in the same subpixel zone, there is a first gap between an orthographic projection of the second body portion onto the base and an orthographic projection of the second electrode of the seventh transistor onto the base, and the first gap is greater than a threshold value.

5. The display panel according to claim 1, further comprising:
a plurality of subpixel driving circuits in a one-to-one correspondence with the plurality of subpixel zones, wherein each of the plurality of subpixel driving circuits comprises a driving transistor and a second transistor;
a gate electrode of the second transistor is coupled to the reset signal line pattern in a previous subpixel zone adjacent along a second direction, a first electrode of the second transistor acts as the target coupling part in the previous subpixel zone, and a second electrode of the second transistor is coupled to a gate electrode of the driving transistor; and
the second transistor comprises two semiconductor portions disposed in a spaced manner along the first direction and a first conductor portion connected to the two semiconductor portions, and an orthographic projection of the first conductor portion onto the base does not overlap with an orthographic projection of the first protruding portion in the previous subpixel zone onto the base.

6. The display panel according to claim 5, wherein the orthographic projection of the first conductor portion onto the base overlaps with an orthographic projection of the first end portion of the conductive connecting part pattern in the previous subpixel zone onto the base.

7. The display panel according to claim 5, wherein the initialization signal line pattern further comprises a second protruding portion coupled to the first body portion, in the same subpixel zone, an orthographic projection of the second protruding portion onto the base is between the orthographic projection of the first body portion onto the base and the orthographic projection of the reset signal line pattern onto the base, and the orthographic projection of the first conductor portion onto the base overlaps with the orthographic projection of the second protruding portion onto the base.

8. The display panel according to claim 5, wherein the conductive connecting part pattern further comprises a second body portion connected between the first end portion and the second end portion, the second body portion extends along the second direction;
an end of the first conductor portion that is close to the conductive connecting part pattern in the previous subpixel zone extends along the second direction, there is a second gap between an orthographic projection of the end onto the base and the orthographic projection of the second body portion of the conductive connecting part pattern onto the base, and the second gap is greater than a threshold value.

9. The display panel according to claim 5, wherein in the same subpixel zone, the orthographic projection of the first end portion of the conductive connecting part pattern onto the base and the orthographic projection of the first body portion of the initialization signal line pattern onto the base further have a second overlapped region; and
the functional film layers further comprise a first connecting hole in each of the plurality of subpixel zones, in the same subpixel zone, an orthographic projection of the first connecting hole onto the base overlaps with the first overlapped region and the second overlapped region respectively, and the first end portion of the conductive connecting part pattern is coupled to the initialization signal line pattern via the first connecting hole.

10. The display panel according to claim 9, wherein the orthographic projection of the first conductor portion of the second transistor onto the base does not overlap with an orthographic projection of the first connecting hole in the previous subpixel zone onto the base.

11. The display panel according to claim 5, wherein the functional film layers further comprise a power signal line layer, the power signal line layer comprises a power signal line pattern disposed in each of the plurality of subpixel zones, and at least part of the power signal line pattern extends along the second direction; and
an end of the first conductor portion that is far away from the conductive connecting part pattern in the previous subpixel zone extends along the second direction, and an orthographic projection of the end onto the base is entirely covered by an orthographic projection of the power signal line pattern in the same subpixel zone onto the base.

12. The display panel according to claim 1, further comprising:
a plurality of subpixel driving circuits in a one-to-one correspondence with the plurality of subpixel zones, wherein each of the plurality of subpixel driving circuits comprises a driving transistor and a storage capacitor, the storage capacitor comprises a first electrode plate and a second electrode plate that are disposed opposite to each other, the first electrode plate also acts as a gate electrode of the driving transistor, and the second electrode plate is on a side of the first electrode plate facing away from the base;
the functional film layers further comprise a power signal line layer, the power signal line layer comprises a power signal line pattern disposed in each of the plurality of subpixel zones, at least part of the power signal line pattern extends along a second direction, and the power signal line pattern comprises a first power portion and a second power portion; and
an orthographic projection of the first power portion onto the base overlaps with the orthographic projection of the reset signal line pattern in the same subpixel zone onto the base and overlaps with an orthographic projection of a gate line pattern in the same subpixel zone onto the base, an orthographic projection of the second power portion onto the base overlaps with an orthographic projection of the second electrode plate of the corresponding storage capacitor onto the base, and a width of the first power portion is less than a width of the second power portion along the first direction.

13. The display panel according to claim 1, wherein the functional film layers further comprise a power signal line layer, the power signal line layer comprises a power signal line pattern disposed in each of the plurality of subpixel zones, and at least part of the power signal line pattern extends along a second direction; and the functional film layers further comprise an auxiliary power layer, the auxiliary power layer comprises an auxiliary power pattern disposed in each of the plurality of subpixel zones, an orthographic projection of the auxiliary power pattern onto the base and an orthographic projection of the power signal line pattern in the same subpixel zone onto the base have an overlapped region, and the auxiliary power pattern is coupled to the power signal line pattern in the overlapped region.

14. The display panel according to claim 13, further comprising a plurality of subpixel driving circuits in a one-to-one correspondence with the plurality of subpixel zones, wherein each of the plurality of subpixel driving circuits comprises a driving transistor and a second transistor;

a gate electrode of the second transistor is coupled to the reset signal line pattern in a previous subpixel zone adjacent along the second direction, a first electrode of the second transistor acts as the target coupling part in the previous subpixel zone, a second electrode of the second transistor comprises a first electrode portion and a second electrode portion coupled to each other, the first electrode portion extends along the second direction, the second electrode portion extends along a third direction, the third direction intersects with both the first direction and the second direction, the first electrode portion is between a semiconductor portion of the second transistor and the second electrode portion, and the second electrode portion is coupled to a gate electrode of the driving transistor; and an orthographic projection of the first electrode portion onto the base and an orthographic projection of the second electrode portion onto the base are both covered by the orthographic projection of the auxiliary power pattern onto the base.

15. The display panel according to claim 14, wherein the auxiliary power pattern comprises a first auxiliary sub-pattern and a second auxiliary sub-pattern coupled to each other, the first auxiliary sub-pattern extends along the second direction and at least part of the second auxiliary sub-pattern extends along the first direction; and an orthographic projection of the first auxiliary sub-pattern onto the base covers the orthographic projection of the first electrode portion onto the base and the orthographic projection of the second electrode portion onto the base.

16. The display panel according to claim 15, wherein a width of the first auxiliary sub-pattern is greater than a width of the corresponding power signal line pattern along the first direction.

17. The display panel according to claim 14, wherein the orthographic projection of the first electrode portion onto the base and the orthographic projection of the second electrode portion onto the base are both covered by an orthographic projection of the corresponding power signal line pattern onto the base.

18. The display panel according to claim 1, wherein the functional film layers comprise a gate line pattern and a light-emission control signal line pattern in each of the plurality of subpixel zones; in the same subpixel zone, the gate line pattern, the light-emission control signal line pattern, the reset signal line pattern and the initialization signal line pattern are sequentially arranged along the second direction;

the functional film layers further comprise a power signal line pattern and a data line pattern in each of the plurality of subpixel zones, and the power signal line pattern and the data line pattern both comprise a portion extending along the second direction;

the display panel further comprises:

light-emitting elements in a one-to-one correspondence with the plurality of subpixel zones; and subpixel driving circuits in a one-to-one correspondence with the plurality of subpixel zones, wherein each subpixel driving circuit comprises a driving transistor, a first transistor, a second transistor, a fourth transistor, a fifth transistor, a sixth transistor and a seventh transistor;

in the same subpixel zone, a gate electrode of the driving transistor is coupled to a second electrode of the first transistor, a first electrode of the driving transistor is coupled to a second electrode of the fifth transistor, and a second electrode of the driving transistor is coupled to a first electrode of the first transistor;

a gate electrode of the first transistor is coupled to the gate line pattern;

a gate electrode of the second transistor is coupled to the reset signal line pattern in the previous subpixel zone adjacent along the second direction, a first electrode of the second transistor acts as the target coupling part in the previous subpixel zone and a second electrode of the second transistor is coupled to the gate electrode of the driving transistor;

a gate electrode of the fourth transistor is coupled to the gate line pattern, a first electrode of the fourth transistor is coupled to the data line pattern, and a second electrode of the fourth transistor is coupled to the first electrode of the driving transistor;

a gate electrode of the fifth transistor is coupled to the light-emission control signal line pattern, and a first electrode of the fifth transistor is coupled to the power signal line pattern;

a gate electrode of the sixth transistor is coupled to the light-emission control signal line pattern, a first electrode of the sixth transistor is coupled to the second electrode of the driving transistor, and a second electrode of the sixth transistor is coupled to the corresponding light-emitting element; and a second electrode of the seventh transistor is coupled to the light-emitting element, a gate electrode of the seventh transistor is coupled to the reset signal line pattern, and a first electrode of the seventh transistor is coupled to the second initialization signal line pattern.

19. A display device, comprising the display panel according to claim 1.

20. A manufacture method of a display panel, comprising: manufacturing functional film layers on a base and forming a plurality of subpixel zones arranged in an array;

wherein the functional film layers comprise: a reset signal line layer, an initialization signal line layer and a conductive connecting part layer;

the reset signal line layer comprises a reset signal line pattern disposed in each of the plurality of subpixel zones, the reset signal line pattern extends along a first direction;

the initialization signal line layer comprises an initialization signal line pattern disposed in each of the plurality of subpixel zones, the initialization signal line pattern comprises a first body portion and a first protruding portion coupled to each other, the first body portion extends along the first direction, in the same subpixel zone, an orthographic projection of the first body portion onto the base is between an orthographic projection of the first protruding portion onto the base and an orthographic projection of the reset signal line pattern onto the base; and the conductive connecting part layer comprises a conductive connecting part pattern disposed in each of the plurality of subpixel zones, in the same subpixel zone, an orthographic projection of a first end portion of the conductive connecting part pattern onto the base and the orthographic projection of the first protruding portion onto the base have a first overlapped region, in the first overlapped region, the first end portion is coupled to the first protruding portion, a second end portion of the conductive connecting part pattern is coupled to a target coupling part in the subpixel zone where the conductive connecting part pattern is located, and the orthographic projection of the reset signal line pattern onto the base is between an orthographic projection of the target coupling part onto the base and an orthographic projection of the initialization signal line pattern onto the base.

* * * * *